(12) United States Patent
Therrien et al.

(10) Patent No.: US 10,848,124 B2
(45) Date of Patent: Nov. 24, 2020

(54) PIEZOELECTRIC TRANSDUCER DEVICE WITH RESONANCE REGION

(71) Applicant: University of Massachusetts, Boston, MA (US)

(72) Inventors: Joel M. Therrien, Westford, MA (US); Lian Dai, Framingham, MA (US); Alireza Amirkhizi, Lowell, MA (US)

(73) Assignee: University of Massachusetts, Boston, MA (US)

( * ) Notice: Subject to any disclaimer, the term of this patent is extended or adjusted under 35 U.S.C. 154(b) by 494 days.

(21) Appl. No.: 15/788,007

(22) Filed: Oct. 19, 2017

(65) Prior Publication Data

US 2018/0109239 A1    Apr. 19, 2018

Related U.S. Application Data

(60) Provisional application No. 62/410,124, filed on Oct. 19, 2016.

(51) Int. Cl.
 - *H01L 41/047* (2006.01)
 - *H03H 9/25* (2006.01)
 - *H03H 9/145* (2006.01)
 - *H01L 41/29* (2013.01)

(52) U.S. Cl.
 CPC ......... *H03H 9/14547* (2013.01); *H01L 41/29* (2013.01); *H03H 9/14561* (2013.01); *H03H 9/25* (2013.01)

(58) Field of Classification Search
 CPC .. H03H 9/14547; H03H 9/14561; H03H 9/25; H01L 41/29

USPC .... 310/313 A–313 D, 313 R, 324, 365, 366; 333/187–193

See application file for complete search history.

(56) References Cited

U.S. PATENT DOCUMENTS

| | | | | |
|---|---|---|---|---|
| 2,945,984 A | * | 7/1960 | Yando | H03K 17/00 315/55 |
| 4,453,242 A | * | 6/1984 | Toda | G11B 3/00 310/313 B |
| 4,477,892 A | * | 10/1984 | Tosima | H04R 23/00 310/313 R |
| 5,291,090 A | * | 3/1994 | Dias | B06B 1/0644 310/334 |

(Continued)

OTHER PUBLICATIONS

Aigner, Robert, "SAW and BAW Technologies for RF Filter Applications: A Review of the Relative Strenghs and Weaknesses", 2008 IEEE International Ultrasonics Symposium Proceedings, pp. 582-589.

*Primary Examiner* — Thomas M Dougherty
(74) *Attorney, Agent, or Firm* — Armis IP Law, LLC

(57) ABSTRACT

According to one configuration, an acoustical device includes a piezoelectric substrate and at least one curved electrode. Material on a surface of the piezoelectric substrate defines boundaries of a resonance region. The curved electrode is disposed on the piezoelectric substrate in the resonance region and is operable to receive a voltage input signal through a first conductive waveguide. When present, the voltage input signal causes generation and conveyance of acoustical waves from the curved electrode into the resonance region. The acoustical device optionally includes a second curved electrode in the resonance region, which converts the acoustical waves present in the resonance region to an output voltage signal.

27 Claims, 21 Drawing Sheets

(56) References Cited

U.S. PATENT DOCUMENTS

| | | | | |
|---|---|---|---|---|
| 5,374,863 A | * | 12/1994 | Mochizuki | H03H 9/14561 |
| | | | | 310/313 B |
| 6,407,650 B1 | * | 6/2002 | MacFarlane | H03H 9/14547 |
| | | | | 310/313 B |
| 2013/0340598 A1 | * | 12/2013 | Marquez | G10H 1/0558 |
| | | | | 84/730 |

* cited by examiner

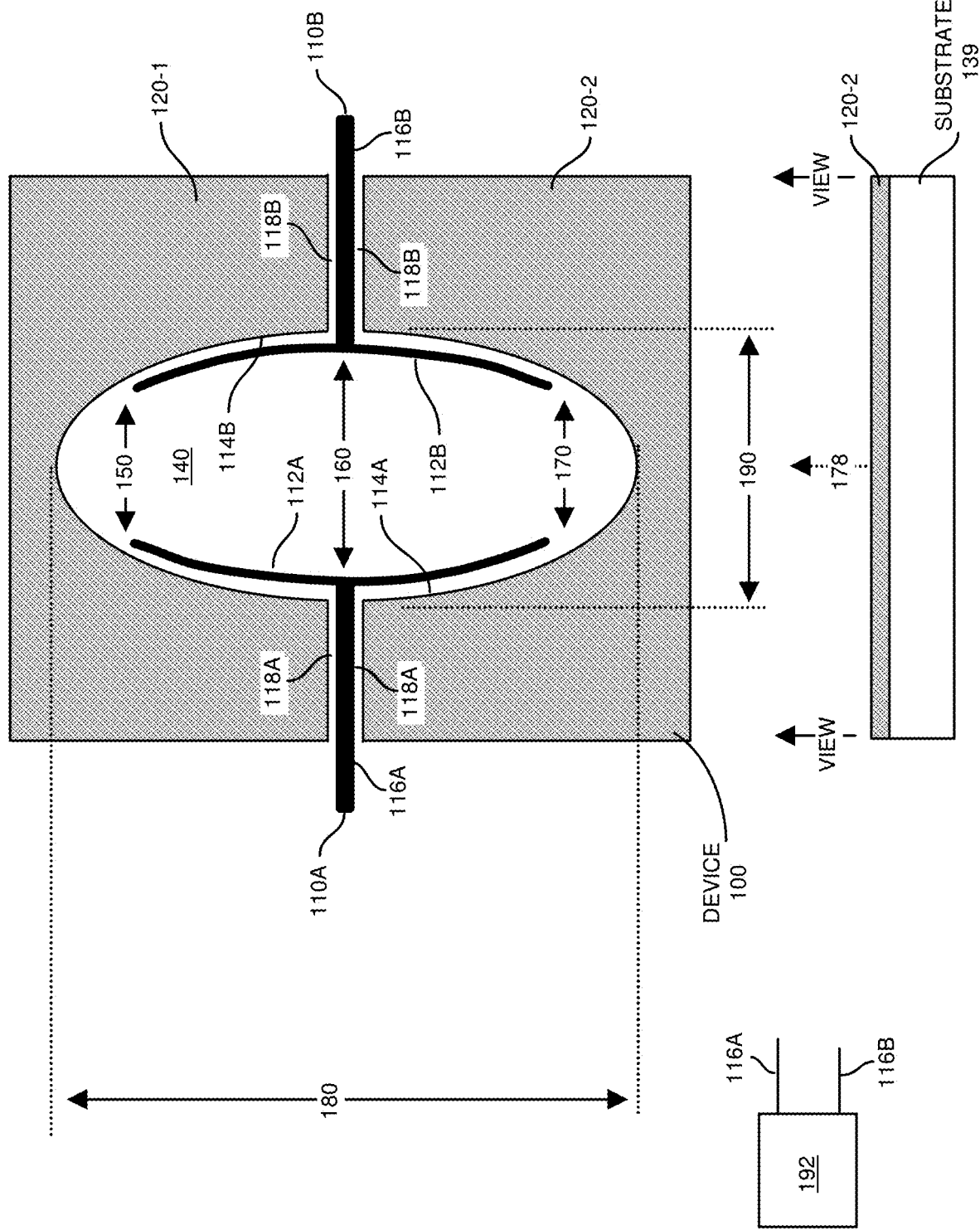

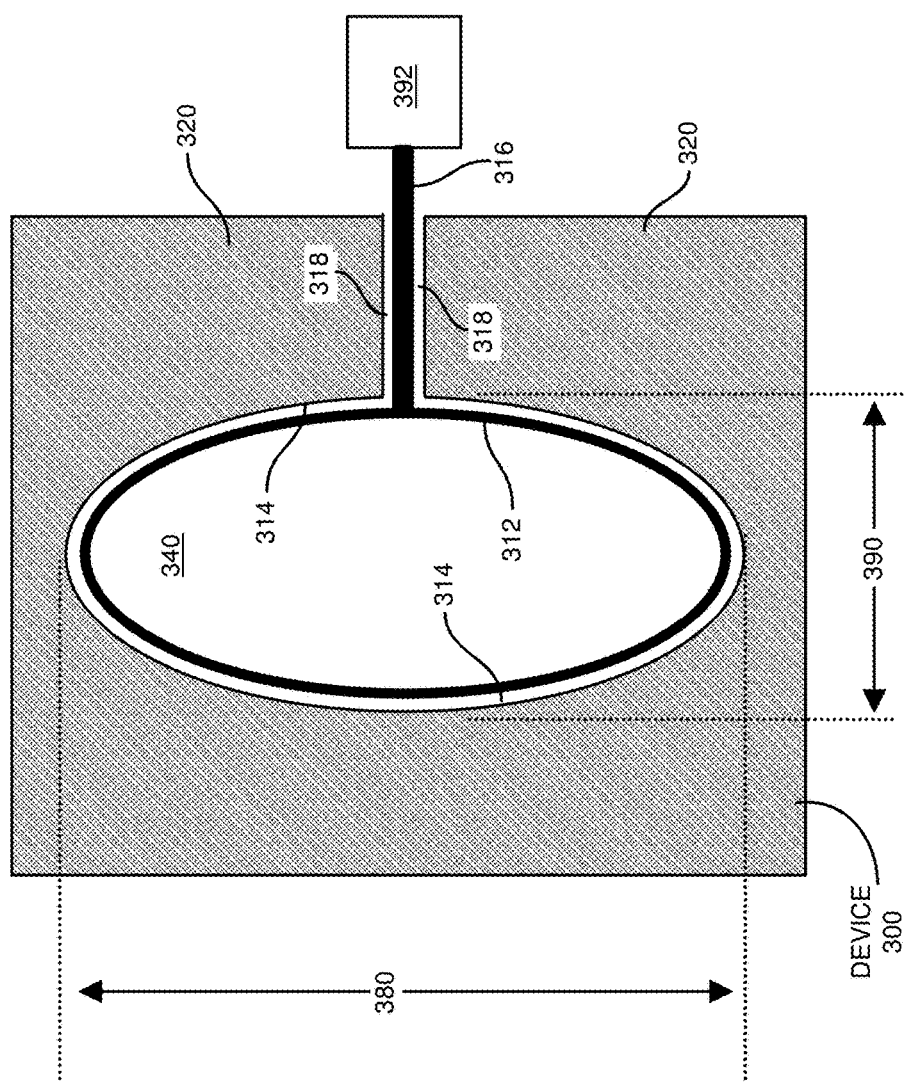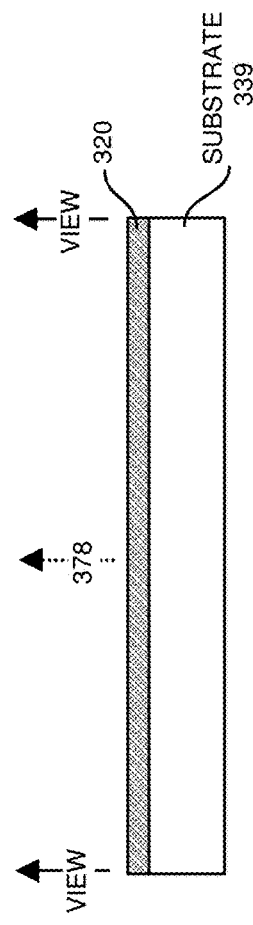

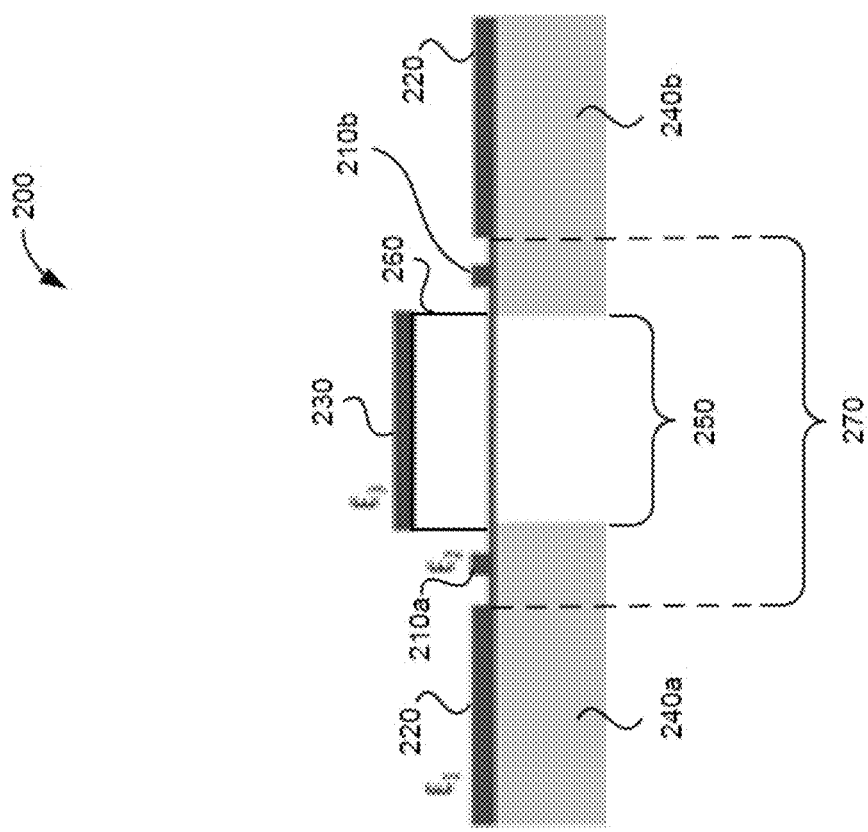

PIEZOELECTRIC TRANSDUCER DEVICE WITH RESONANCE REGION

RELATED APPLICATIONS

This application is related to and claims the benefit of earlier filed U.S. Provisional Patent Application Ser. No. 62/410,124 entitled "Surface Acoustic Wave (SAW) Device," filed on Oct. 19, 2016, the entire teachings of which are incorporated herein by this reference.

BACKGROUND

As shown in FIG. 1, conventional Surface Acoustic Wave (SAW) sensors typically consist of a pair of transducers designed to excite/detect undulations in the surface of a piezoelectric material. The transducers are normally arranged in a linear configuration such that the wave emitted by one travels across the substrate to the receiving electrode.

When used as a sensor, the spacing between the transducers and/or mechanical properties of the substrate may affect properties associated with the waves such as the velocity, amplitude, and/or phase of the wave. Thus, the addition of a material, or the change in mechanical properties of the substrate due to exposure to a compound will result in a change in the frequency, amplitude or phase of the acoustic wave.

The wave is generated and detected by use of an electrode that is referred to as an Inter-Digitated Transducer (IDT) as shown in FIG. 1 (prior art). In general, each conventional IDT is composed of two interlocking comb-shaped electrodes. When a voltage is applied across the electrodes of IDT 101-1, the piezo surface region 102 warps. When the voltage is relaxed to zero, these distortions travel outwards as Rayleigh waves to IDT 101-2. If an alternating voltage is applied to the electrodes, a series of waves are generated. If the frequency that the voltage is cycled at the appropriate rate, the waves will reach the next electrode pair just in time for a reinforcing distortion to occur, resulting in constructive interference. At other frequencies, the waves will be dissipated by distortions that counter the wave, resulting in destructive interference.

The reason SAW devices can generate signals within a very narrow range of frequencies is that a large number of electrode pairs are typically used in a device. The effect is similar to that of Bragg grating or a dielectric stack filter; the large number of periods involved is more effective in eliminating or attenuating frequencies that do not match the desired frequency. Frequency is selected via material properties and the spacing between the electrode pairs. A well-designed IDT will confine the majority of the generated acoustical energy in a line perpendicular to the length of the individual electrodes.

BRIEF DESCRIPTION OF EMBODIMENTS

There are deficiencies associated with conventional SAW devices as previously discussed. For example, although one strength of the conventional SAW design is that a wide range of frequencies can be specified for a device simply by changing the electrode spacing within the IDT (Inter-Digitated Transducer), without needing to alter substrate thickness, this comes at the price of needing a relatively large area for the IDTs. If a conventional SAW device such as in FIG. 1 is designed for use at up to around 50 MHz, the entire device will typically measure 1 or more centimeters. This is a very large sized device and is unacceptable in many applications. Even at higher frequencies, much more than half of the surface area of a conventional SAW device is devoted to the IDTs, rather than the sensing area in between. This is due to the need for a sufficient number of electrode pairs to ensure a narrow frequency bandwidth. In addition, as the frequency of operation is increased, the spacing between electrodes in the IDT has to decrease. At frequencies exceeding 2.4 GHz, this becomes expensive to manufacture and the failure rate in device fabrication becomes unacceptably high.

A second drawback of conventional SAW sensor design is the need for good phase matching. The spacing between the transmitting and detecting IDTs must be such that there is an even number of wavelengths that will fit, otherwise the phase of the input and output signals will not be matched well and this leads to a weak overall signal.

Embodiments herein include improvements over conventional techniques. More specifically, in one embodiment, a multi-electrode acoustical device comprises a piezoelectric substrate. The piezoelectric substrate includes a resonance region as defined by a layer of electrically conductive material disposed (in one or more regions) on the surface of the piezoelectric substrate. In one embodiment, the resonance region is free from being covered with the layer of electrically conductive material.

The device as discussed herein further includes a first curved electrode that is disposed on the piezoelectric substrate and is operable to receive a voltage input signal through a first conductive lead (or waveguide). When present, the voltage input signal causes generation and conveyance of acoustical waves (mechanical waves that travel) from the first curved electrode into the resonance region of the device. A second curved electrode of the device receives and converts the acoustical waves present and traveling through the resonance region into an output voltage signal. A second conductive lead (or second waveguide) of the acoustical device conveys the output voltage signal from the second curved electrode to a remote electronic circuit.

Note that as an alternative to a multi-electrode device, the acoustical device as discussed herein can be a single-electrode acoustical device. In one embodiment, a layer of electrically conductive material is disposed (in one or more regions) on the surface of a piezoelectric substrate. The layer of electrically conductive material defines a resonance region of the device. A curved electrode is disposed on the surface of the substrate in the resonance region such as near a boundary of the resonance region. The curved electrode is non-contiguous with respect to the layer of waveguide material. In other words, the curved electrode does not touch the surrounding layer of conductive material disposed on the piezoelectric substrate to define the resonance region. The curved electrode in the device is operable to generate acoustical waves into the resonance region based on a received input voltage signal.

In one embodiment, the curved electrode is a strip of electrically conductive material disposed adjacent to a boundary of the resonance region as defined by the layer of electrically conductive material (such as waveguide material). The strip of electrically conductive material (representing the curved electrode) can be continuous to form an elliptically shaped ring on the surface of the substrate.

Yet another embodiment herein includes a device comprising: a plane region; a resonance region (i.e., resonating region) within the plane region, the resonance region including a piezoelectric substrate and a membrane suspended over an open region of the piezoelectric substrate; a first electrode having (1) a lead portion for receiving a signal and (2) a curved portion for applying the signal to the resonance region thereby causing the resonance region to generate acoustic waves in response to the signal; a second electrode having (1) a curved portion for acquiring the acoustic waves from the resonance region and (2) a lead portion for transferring a signal, generated by the second electrode based on the acquired waves, from the device; and a third electrode coupled to the membrane, the third electrode for modulating a tension on the membrane thereby affecting a velocity of the acoustic waves as they travel from the first electrode to the second electrode via the resonance region.

Further embodiments herein include fabrication of the multi-electrode device as described herein. In one embodiment, a fabricator receives a piezoelectric substrate. The fabricator applies a layer of electrically conductive material to a surface of the substrate to produce a coplanar waveguide; edges of the layer of electrically conductive material define a resonance region. The fabricator further disposes a first curved electrode on the piezoelectric substrate in the resonance region. The first curved electrode is disposed on the substrate to receive a voltage input signal to generate acoustical waves in the resonance region. In one embodiment, the device is a multiple-electrode device. In such an instance, the fabricator disposes a second curved electrode on the piezoelectric substrate. The second curved electrode is disposed on the substrate in or near the resonance region to convert the acoustical waves present in the resonance region to an output voltage signal.

Yet further embodiments herein include fabrication of a single electrode device. In one embodiment, the fabricator receives a piezoelectric substrate. The fabricator applies a layer of electrically conductive material to a surface of the substrate to define boundaries of a resonance region on the piezoelectric substrate. The fabricator also disposes a curved electrode onto the piezoelectric substrate. In one embodiment, the curved electrode (such as made from a layer of electrically conductive material) on the surface of the substrate is non-contiguous with respect to the layer of material. In one embodiment, the strip of conductive material is continuous to form an elliptically shaped ring on the surface of the substrate. The fabricator further disposes a lead (such as a waveguide, metallic strip of material, etc.) on the substrate to convey voltage signals, an end of the lead terminating at the curved electrode.

Use and fabrication of one or more curved electrodes as discussed herein reduces or eliminates the need for a large number of repeated electrode pairs to generate acoustical waves as in the prior art. Embodiments herein also help to maximize the amount of surface (such as resonance region) area devoted to sensing acoustical waves. These and other more specific additional embodiments are disclosed herein as further discussed below.

As discussed herein, techniques herein are well suited for use in the field of acoustical devices, sensing applications, filter applications, etc. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section (which is a summary of embodiments) and corresponding figures of the present disclosure as further discussed below.

BRIEF DESCRIPTION OF THE DRAWINGS

The accompanying drawings, which are incorporated in and constitute a part of this specification, illustrate one or more embodiments described herein and, together with the description, explain these embodiments. In the drawings:

FIG. 2A is an example top view diagram illustrating a multi-electrode surface acoustic wave (SAW) device according to embodiments herein.

FIG. 2B is an example cross sectional view diagram illustrating a multi-electrode surface acoustic wave (SAW) device according to embodiments herein.

FIG. 3A is an example top view diagram illustrating a single-electrode surface acoustic wave (SAW) device according to embodiments herein.

FIG. 3B is an example cross sectional view diagram illustrating a single-electrode surface acoustic wave (SAW) device according to embodiments herein.

FIG. 4 is an example diagram illustrating a cross-sectional diagram of a tunable SAW device according to embodiments herein.

Figure 1:
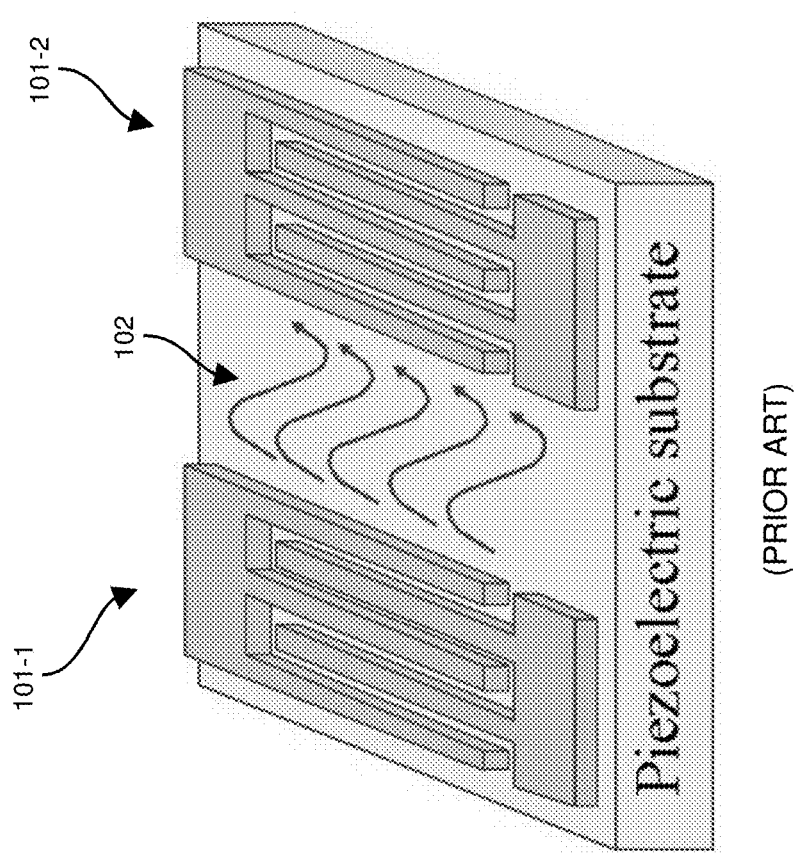
FIG. 1 is an example diagram illustrating an SAW device according to the prior art.

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

As previously discussed, according to one embodiment, an acoustical device includes a piezoelectric substrate and at least one curved electrode. Material on a surface of the piezoelectric substrate defines a waveguide and corresponding boundaries of a resonance region (drum). The curved electrode is disposed on the piezoelectric substrate in the resonance region and is operable to receive a voltage input signal through a first conductive lead such as a waveguide. When present, the voltage input signal causes generation and conveyance of acoustical waves from the curved electrode into the resonance region. The acoustical device optionally includes a second curved electrode in the resonance region to receive the acoustical waves present in the resonance region. The second curved electrode converts the acoustical waves present in the resonance region to an output voltage signal. These and further embodiments are discussed herein.

Now, more particularly, FIG. 2A illustrates an example embodiment of a SAW device 100 that employs an electrode structure according to embodiments herein.

As shown, the SAW device 100 includes a first (curved) electrode 110A such as a first electrically conductive strip of material, a second (curved) electrode 110B such as a second electrically conductive strip of material, regions 120-1 and 120-2, and a resonance region 140. Electrodes 110A and 110B are surrounded by the regions 120 (layer of electrically conductive material).

Note that FIG. 2B is a cross section view of FIG. 2A. FIG. 2B shows how conductive material (such as regions 120, conductive lead 116A, 116B, curved electrode 112A, curved electrode 112B, etc.) can be disposed on substrate 139 to produce the respective device 100.

Referring again to FIG. 2A, in one embodiment, note that the regions 120 act as coplanar waveguide disposed on substrate 139, enabling a transfer electrical signals to/from the curved electrodes 112A and 112B of device 100. The regions also define boundaries of the resonance region 140.

The first electrode 110A (combination of conductive lead 116A and curved electrode 112A), second electrode 110B (combination of conductive lead 116B and curved electrode 112B), and/or the regions 120 are fabricated from an electrically conductive material such as including or made of metal.

For example, the first electrode 110A, the second electrode 110B, and/or the plane region 120 may include one or more material such as gold, aluminum, silver, copper, etc. Note that first electrode 110A, second electrode 110B, and/or regions 120, etc. can be fabricated to include any type of suitable electrically conductive material.

As previously discussed, the first electrode 110A includes curved electrode 112A and a conductive lead 116A (such as a strip line or waveguide). The curved electrode 112A is shaped to form an arc. In one embodiment, the electrode 112A is spaced apart from and is substantially parallel to the boundary 114A as defined by region 120-1 and region 120-2. Resonance region 140 (elliptical white space) is defined by elliptical boundaries 114A and 114B associated with regions 120-1 and 120-2.

Note further that the curved electrode 112A is spaced apart and is substantially parallel with respect to boundary 114A.

As further shown, the conductive lead 116A is electrically connected to the curved electrode 112A. Portions of region 120-1 and 120-2 are spaced apart (via spacings 118A) with respect to the conductive lead 116A. Spacings 118A ensure that any voltage signal inputted on the conductive lead 116A is not shorted to the region 120-1 or 120-2.

The second electrode 110B includes curved electrode 112B and a conductive lead 116B (such as a strip line, waveguide, etc.). The curved electrode 112B is shaped to form an arc. In one embodiment, the electrode 112B is substantially parallel to the boundary 114B as defined by region 120-1 and region 120-2. As previously discussed, resonance region 140 (white space) is defined by elliptical inner boundaries 114A and 114B associated with regions 120-1 and 120-2.

The curved electrode 112B is spaced apart and optionally or substantially parallel with respect to boundary 114B. As further shown, the conductive lead 116B is electrically connected to the curved electrode 112B. Portions of region 120-1 and 120-2 are spaced apart (via spacings 118B) with respect to the conductive lead 116B. Spacings 118B ensure that any voltage signal outputted (or inputted) on the conductive lead 116B is not shorted to the region 120-1 or 120-2.

Note that spacings between curved electrode 112A and regions 120 and spacings between curved electrode 112B and regions 120 as well as respective widths of the electrodes 110A and 110B may be adjusted to accommodate matching an impedance of the respective electrode 110A/110B of the SAW device 100 to corresponding electronic circuitry (such as electronic circuitry 192) that may be coupled to the SAW device 100 via lead portions 116A/116B. Adjustments may be made, for example, to define an input and/or output impedance associated with the SAW device 100.

Note that adjusting the width of an electrode 110A may include, for example, adjusting a width between curved electrodes, adjusting a width of the lead portions 116 of the respective electrode 110, etc.

As a more specific example, suppose that electrode 110A acts as an input voltage port for the SAW device 100 and electrode 110B acts as an output voltage port for the SAW device 100, where the input voltage port may be used to input a voltage signal into the SAW device 100 and the output voltage port may be used to output a voltage signal from the SAW device 100. Further, suppose that electrode 110A is coupled to electronic circuitry 192 that provides a signal to the input port and electrode 110B is coupled to electronic circuitry 192 that receives a signal from the output port. In addition, suppose that electrodes 110A and 110B and regions 120 are layers of electrically conductive material such as metal. Regions 120 can be connected to a voltage potential such as ground.

Note that matching the impedances of the input and output ports to circuitry coupled to these ports may obviate signal loss (e.g., due to a high standing wave ratio (SWR)) that may present if the ports were not matched to their respective transmitter/receiver electronic circuitry. In addition, it should be noted that the impedance of the input port (116A) and output port (116B) may be adjusted independently from each other. Thus, SAW device 100 may operate in environments where the input port and output port impedances may differ.

Adjusting the input and/or output impedance of the SAW device 100 obviates a need for external matching devices that may otherwise be required to impedance match the input and output ports to circuitry coupled to these ports.

The resonance region 140 (region through which acoustical waves propagate) may be, for example, a non-metalized region that includes a piezo (e.g., piezoelectric) material. In one embodiment, the resonance region 140 is an exposed, non-metalized surface region of the (piezoelectric) substrate 139.

It should be noted that other substrates that may, for example, have a surface mode with low dissipation, may be used as a substitute. For example, in one embodiment, the resonance region 140 can be configured to include a microelectromechanical system (MEMS) membrane.

From a top view looking down as shown in FIG. 2A, the resonance region 140 may be curved or circular-shaped (e.g., oval, ellipse, circle, etc.). The resonance region 140 may have a predefined length 180 and width 190. It should be noted that in one embodiment, the ratio of length 180 and width 190 is equal to an inverse of a ratio of surface wave velocities in their respective directions. As previously discussed, dimensions of the resonance region 140 (length 180 and width 190), dimensions of curved electrode 112A, curved electrode 112B, etc., define which acoustical frequencies are able to resonate in the resonance region 140.

First ends of the curved electrodes 112 can be spaced apart as specified by spacing 150 (such as between 100 to 1000 μm). Second ends of the curved electrodes 112 can be spaced apart as specified by spacing 170 (such as between 100 to 1000 μm).

Spacing 160 indicates a distance between, for example, a center of the curved electrode 112A and curved electrode 112B.

During operation, applying a signal (e.g., radio frequency (RF) signal such as an alternating voltage or bias voltage) to a lead portion 116A of a first electrode 110 induces generation of acoustical waves in the resonance region 140. These waves travel at a Rayleigh wave velocity and may be in the form of, for example, drumhead modes, that form at frequencies based at least in part on width 190. Note that resonance region 140 can operate in a drumhead mode in which acoustical waves emanate in direction 178 (FIG. 2B) from resonance region 140 based on presence of acoustical waves in resonance region 140.

Referring again to FIG. 2A, the waves propagating along the surface (or near surface) of the substrate defined by the resonance region 140 may be considered Bessel Undulations in a Z direction. The induced waves travel from the first curved electrode 110A through the resonance region 140 to the second curved electrode 110 via the resonance region 140. Acoustical waves that reach the second curved electrode 110B are converted to an output voltage signal that is output from conductive lead 116B.

Thus, the first and second electrodes 110 may act as transducers. Specifically, the first electrode 110 may act as a transducer that converts an input voltage signal applied to the SAW device 100 to acoustical waves. In addition, the second electrode 110 may act as a transducer that converts received acoustical waves propagating through or present in the resonance region 140 to an output voltage that is outputted from the SAW device 100.

In accordance with one embodiment, the device 100 is a sensor device. Received acoustical signals induce generation of acoustical waves in the resonance region 140. The electrodes receive and convert the acoustical waves in resonance region 140 into a respective voltage signal outputted from lead 116A or 116B.

In accordance with another example embodiment, assume that resonance region 140 is oval (elliptical) and that the corresponding substrate 139 is made from a piezoelectric material such as quartz. In addition, suppose that plane region 120 is grounded. Further assume that an RF signal is applied to lead portion 116A of electrode 110A and that a voltage of the RF signal varies in magnitude with respect to the region 120 (such as connect to ground).

In such an instance, curved electrode 112A applies the RF signal to the resonance region 140, thereby causing the resonance region 140 to generate waves (e.g., acoustic waves) in response to the input signal. Specifically, the resonance region 140 (and at least corresponding surface) distorts in response to the RF signal. Waves form in the resonance region 140 in response to the distortion of the resonance region 140. The waves travel across the surface of the resonance region 140 from curved electrode 112A to electrode 112B. Since waveguide region 120 is grounded, waveguide region 120 acts as a short-circuit for the resonance region 140 and clamp waves that may impinge on the boundary of the resonance region 140/regions 120.

Note that in the above example, the voltage applied to electrode 110A induces warping in the piezoelectric material contained in the resonance region 140. However, when the voltage is relaxed (set equal to a voltage potential applied to regions 120), a respective acoustical wave travels inwards toward the center of the resonance region 140 and continues traveling to the opposite side of the resonance region 140 to curved electrode 112B.

As mentioned, (waveguide, coated, etc.) regions 120 act to short-circuit the piezo surface of the resonance region 140, countering a potential that may develop when curved by the presence of a surface wave. Thus, the region 120 acts to clamp a wave that impinges on the boundary between resonance region 140 and corresponding regions 120. This may establish a boundary condition on a surface wave, where an amplitude of the wave may be zero at the edge of the resonance region 140 as defined by the shape of the plane region 120 in the resonance region 140. Modes that may support this boundary condition can be described by, for example, Bessel functions (e.g., Bessel functions of the first kind), where a frequency may be set by width 190.

It should be noted that the velocity of the wave may vary as it travels across the surface of the resonance region 140. The shape and/or composition of the resonance region 140 may be adjusted to account for this. For example, an oval/elliptical shaped resonance region 140 (or substrate 139) can include a quartz-based surface. It should be noted that other piezo material may be used for substrate 139 and surface of resonance region 140. Moreover, it should be noted that the resonance region 140 may be shaped in a manner other than described above. In one embodiment, the resonance region 140 is circular shaped.

It should also be noted that one may enhance an existing resonant frequency if, for example, the surface wave has an antinode located at, for example, a same radial distance as the driving electrode. Frequency may also be affected by, for example, how far the acoustic wave can penetrate an outer ground plane. The wave may be prevented from spreading into the ground plane due to, for example, metallization neutralizing surface charges generated by the acoustic waves.

As previously discussed, acoustical waves in a SAW device 100 can be initiated by a warping of the surface of the resonance region 140 between adjacent curved electrode electrodes 112A and 112B. As such, there may be no particular requirement that the material in the resonance region 140 be, for example, piezoelectric nor be a solid surface. If a portion of a substrate used to implement the resonance region 140 were removed (e.g., by an anisotropic etching process) and replaced by a membrane that contains, for example, silicon nitride (SiN), molybdenum disulfide (MoS2), or graphene, the acoustic waves may still be capable of traversing the SAW device 100, thus maintaining the resonant modes of the SAW device 100. A fundamental resonant frequency of a circular membrane may be defined by the following equation:

$$f_0 = \frac{0.766}{D} \sqrt{\frac{E\varepsilon}{\rho}}$$

Based on the Young's modulus, E, and density, r, of graphene and a stress, e, of 1%, a 1 GHz device would have a diameter of 1.8 micrometers (um), which would be well within the capabilities of microlithography. Unlike a device fabricated on a completely solid surface, the suspended membrane may have tension applied to it via the application of a voltage (e.g., a direct current (DC) voltage) between it and an adjacent electrode. With graphene sheets, the frequency of the mechanical vibrations may be shifted by, for example, up to 50 percent of the original resonant frequency. Moreover, employing a membrane in the resonance region 140 may provide for a tunable SAW device.

Note that regions 120, conductive lead 116A, conductive lead 116B, curved electrodes 112A, 112B, etc., can be any suitable thickness on substrate 139. In one embodiment, the layer of conductive material need only be thick enough to conduct electricity. By way of non-limiting example embodiment, the respective layer of conductive material of these elements items is between 50 and 500 nanometers, although such elements can be any suitable thickness outside this range.

FIG. 3A is an example diagram illustrating a device according to embodiments herein.

As shown in this example embodiment, the device 300 includes a conductive lead 316 and curved electrode 312.

A layer of electrically conductive material on a surface of the substrate 339 (FIG. 3B) represents region 320. The region 320 defines corresponding boundaries of resonance region 340 (such as a drumhead) in FIG. 3A. Curved electrode 312 (such as a strip of conductive material) is disposed on the surface of the substrate 339 as well.

As further shown in FIG. 3A, in one embodiment, the curved electrode 312 is non-contiguous with respect to the region 320 (coplanar waveguide produced via layer of conductive material disposed on substrate 339). In other words, the curved electrode 340 is spaced apart from region 320 via appropriate spacings between the curved electrode 312 and the region 320 to ensure that the curved electrode 312 is not shorted to the region 320.

In this example embodiment, curved electrode 312 is operable to generate acoustical waves into the resonance region 340 (curved or elliptical shaped) based on a input voltage signal inputted to the conductive lead 316. In a similar manner as previously discussed, the spacings 318 ensure that the conductive lead 316 (waveguide) is not grounded to the region 320.

In one embodiment, in a similar manner as previously discussed, the curved electrode 312 of the device 300 is a strip of electrically conductive material disposed adjacent to and spaced apart from a boundary 314 of the resonance region 340 as defined by the layer of electrically conductive material forming region 320. In such an instance, the strip of electrically conductive material is continuous to form an elliptically shaped ring (in resonance region 340) on the surface of the substrate 339.

In accordance with further embodiments, the curved electrode 312 can be a strip of electrically conductive material disposed substantially parallel (but spaced apart) with respect to a boundary 314 between region 320 and resonance region 340. As shown, the resonance region 340 (space inside region 320) on the surface of the substrate 339 is elliptical in shape as defined by the waveguide material (region 320) disposed on the surface of the piezoelectric substrate 339. However, note that the resonance region 340 can be any suitable shape.

As further shown, the device 300 includes a conductive lead 316 terminating at the curved electrode 312. The conductive lead 316 (such as a waveguide) provides a way to convey a voltage input signal (varying voltage or bias voltage) to the curved electrode 312 to generate an acoustical waves in the resonance region 340. In a similar manner as previously discussed, region 320 (such as made from a conductive material) can be grounded.

Note further that the conductive lead 316 (waveguide) terminating at the curved electrode 312 can be configured to receive a voltage output signal from the curved electrode 312 based on acoustical waves present in the resonance region 340. Presence of the acoustical waves in the resonance region 340 generates a respective output voltage.

In a similar manner as previously discussed, note that the dimensions 380 and 390 can be chosen to be any suitable values supporting acoustical waves at one or more desired resonance frequencies.

In one embodiment, the conductive lead 316 (such as a waveguide, strip line, etc.) is both driven and monitored by the electronic circuitry 392. For example, during an output mode, the electronic circuitry 392 drives the conductive lead 316 with a driving voltage signal while the region 320 is connected to the voltage potential such as ground. Input of the varying voltage signal causes the resonance region 340 to produce an acoustical wave on substrate 339. This causes a so-called ping (such as out of the resonance region 340 in the direction 370) to emanate from resonance region 340 as shown in FIG. 3B.

In one non-limiting example embodiment, subsequent to generating the ping, assume that an object reflects at least a portion of the ping energy back to the resonance region 340 (such as a detector region). In such an instance, the resonance region 340 will vibrate causing the curved electrode 312 to generate a voltage that is conveyed along conductive lead 316 to the electronic circuitry 392. The electronic circuitry 392 monitors the time between the generated ping and receiving the reflected ping signal to determine the distance of the object with respect to the device 300.

Note that further embodiments herein can include applying a respective input voltage signal to the conductive lead 316 to cause generation of one or more acoustical waves on the surface of the resonance region 340. The acoustical waves produce an output voltage at one or more frequencies. The electronic circuitry 392 can be configured to monitor the output voltage and corresponding one or more frequencies of the generated acoustical waves.

FIG. 4 illustrates a cross-sectional diagram of an example embodiment of a tunable SAW device 200 according to embodiments herein. Referring to FIG. 4, the SAW device 200 may include a first electrode 210a, a second electrode 210b, a plane region 220, a third electrode 230, a substrate 240 (combination of 240a and 240b), and a membrane 260. The first and second electrodes 210a, 210b and plane region 220 may act similar to electrodes 110A, 110B (FIG. 1) and region 120, respectively.

A resonance region 270 for the tunable SAW device 200 may include substrate 240, membrane 260, and third electrode 230. Substrate 240 may include, for example, a piezo material such as, quartz. Substrate 240 may be etched to form an open region 250 between portions 240a and 240b of the substrate 240.

Membrane 260 may be suspended over the open region 250. Electrode 230 is coupled to the membrane 260. In an embodiment, tension on the membrane 260 is modulated by electrode 230 based on, for example, electrostatic attraction between the membrane 260 and the electrode 230.

During operation, waves (e.g., acoustic waves) generated at an electrode 210 (e.g., electrode 210a) travel via substrate 240 and membrane 260 to the other electrode 210 (e.g., electrode 210b). Electrode 230 detects the waves as the waves pass through the membrane 260. Here, for example, membrane 260 acts as a medium for transmitting the waves.

Note that a velocity of the waves may be altered, for example, by adjusting a tension applied to the surface of the membrane 260. In an embodiment, tension may be adjusted, for example, using a differential gas pressure across the membrane 260. In another embodiment, tension may be adjusted using an electrostatic field.

Figure 5:
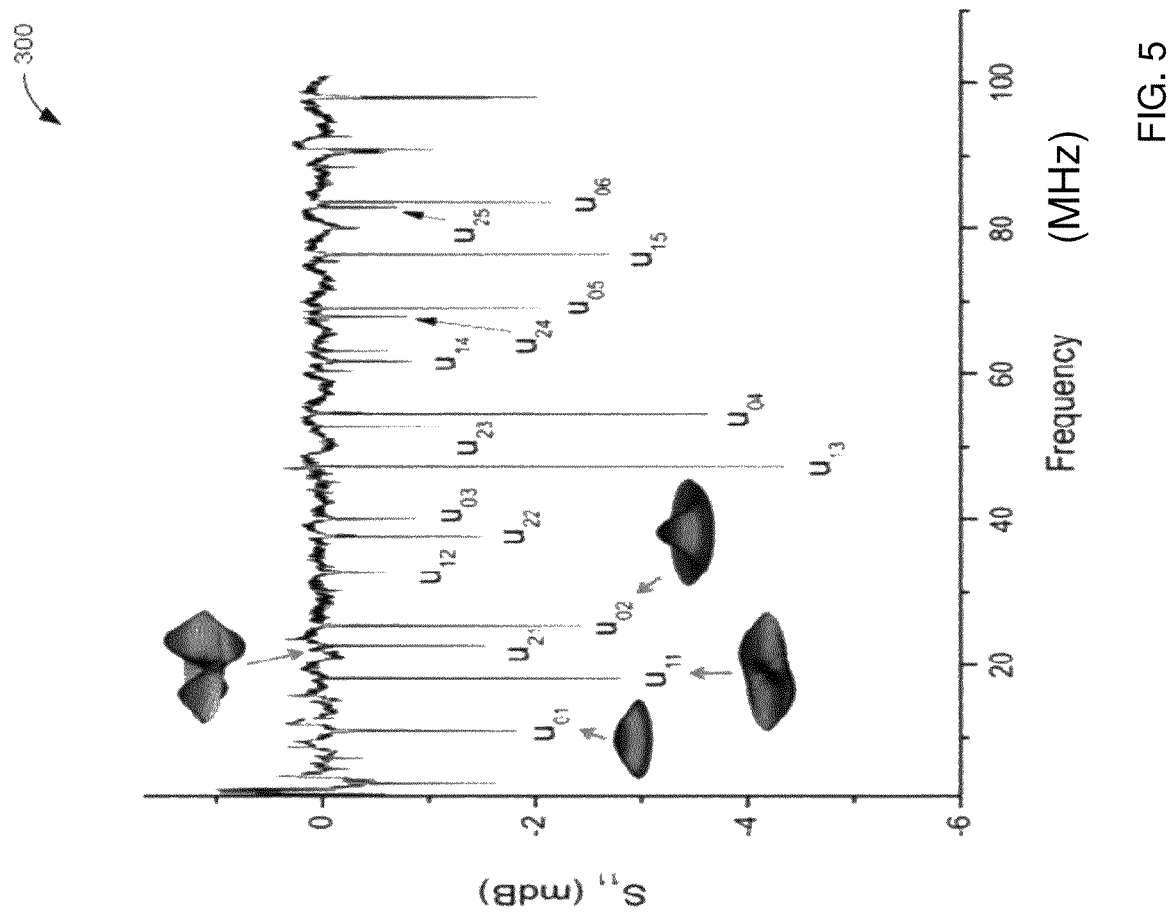
FIG. 5 is an example diagram illustrating a plot of resonance for a SAW device according to embodiments herein.

FIG. 5 is an example diagram illustrating an example plot 300 of resonances for an embodiment of SAW device 100 according to embodiments herein. Plot 300 shows responses of the embodiment for a fundamental frequency of 10.9 Megahertz (MHz). Note that the plot 300 shows several harmonics of the fundamental frequency. With improved impedance matching, the reflection and transmission behavior can be improved as shown in FIGS. 6 and 7.

Figure 6:
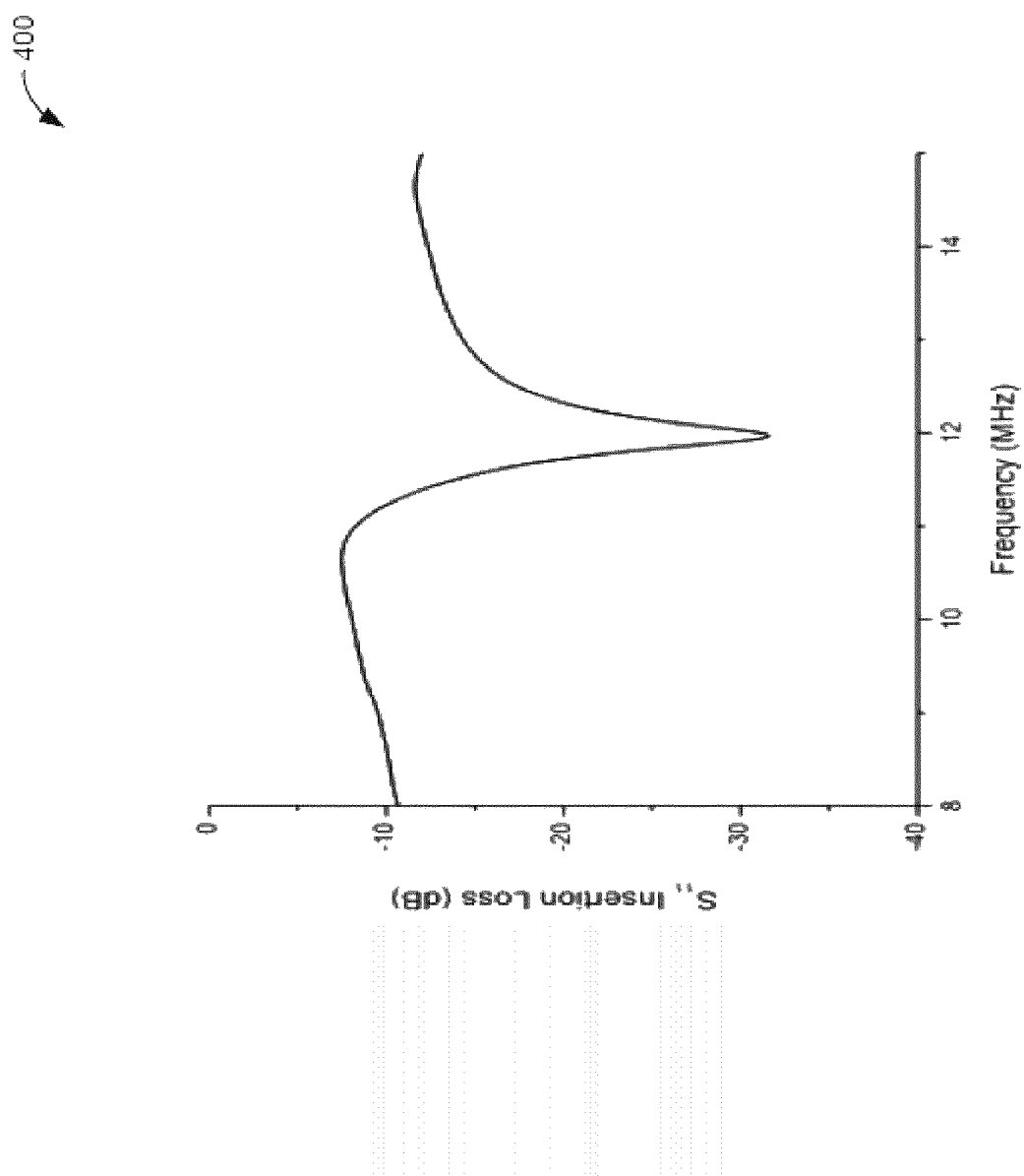
FIG. 6 is an example diagram illustrating an example plot of reflection behavior for a SAW device according to embodiments herein.

FIG. 6 illustrates an example plot 400 of reflection behavior for an embodiment of a SAW device that is designed to resonate at 11.9 MHz. Referring to FIG. 6, note that the plot 400 shows a decrease in reflection that occurs at around the frequency 11.9 MHz. This frequency may be considered a resonant frequency for this embodiment of the SAW device 100.

Figure 7:
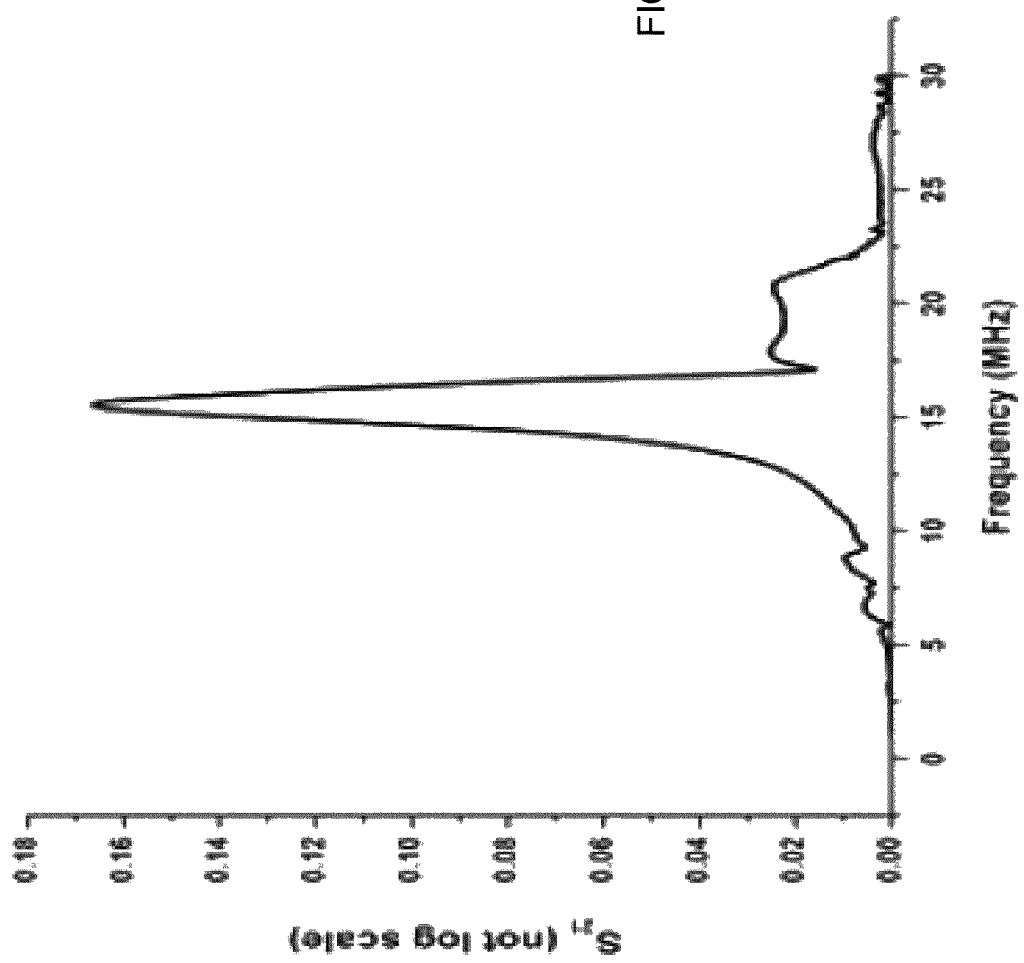
FIG. 7 is an example diagram illustrating a plot of transmission behavior for a SAW device according to embodiments herein.

FIG. 7 illustrates an example plot 500 of transmission behavior for an embodiment of SAW device 100 that is designed for a frequency of 15 MHz. Referring to FIG. 7, the plot 500 shows signal strength versus frequency. Note that signal from the SAW device tends to peak around 15 MHz, which in this embodiment, is the resonant frequency of the respective SAW device.

Note that the SAW devices as discussed herein may be used in, for example, a system capable of receiving a frequency hopping coded signal such as a code division multiple access (CDMA) signal.

Figure 8:
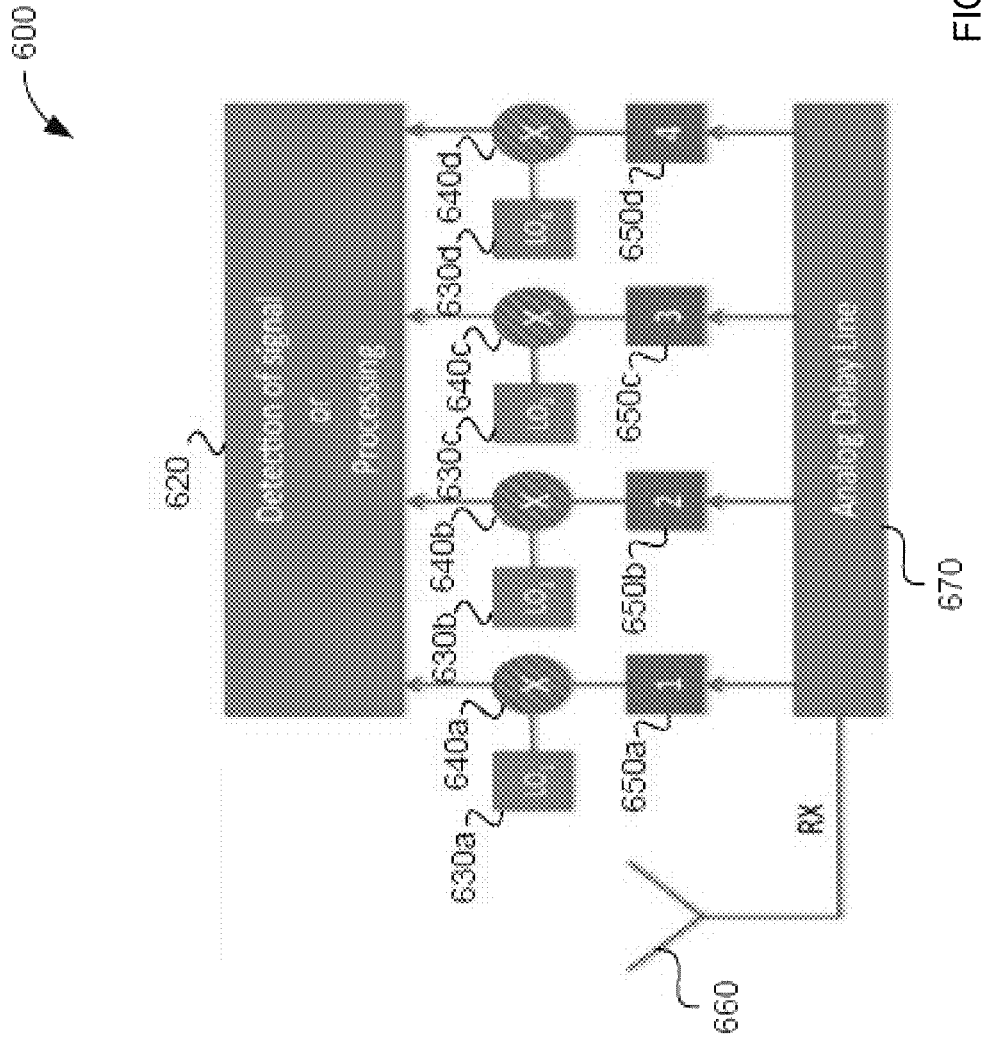
FIG. 8 is an example diagram illustrating a block diagram of an example system for receiving a frequency hopping coded signal that employs a plurality of SAW devices according to embodiments herein.

FIG. 8 is an example diagram illustrating a block diagram of an example embodiment of a system 600 that may be used to receive such a signal according to embodiments herein.

Referring to FIG. 8, system 600 includes signal detection circuitry 620, local oscillator circuitry 630a-d, mixer circuitry 640a-d, SAW devices 650a-d, an analog delay line 670, and an antenna 660.

The antenna 660 may receive coded signals (e.g., CDMA signals) to be processed. The analog delay line 670 provides a predefined delay for the signals received by the antenna 660. The delay line 670 includes a series of taps that may produce a set of signals that are fed from the analog delay line 670 to the SAW devices 650a-d.

The SAW devices 650a-d processes the set of signals prior to the signals being fed to the mixer circuitry 640a-d. For example, the SAW devices 650a-d act as filters that filter the set of signals. The processed signals are fed from the SAW devices 650a-d to the mixer circuitry 640a-d. In an embodiment, the SAW devices 650a-d are arranged as a switched array. By selecting a series of fixed frequencies for the SAW devices 650a-d and selecting one or more of the SAW devices 650a-d, the frequency of the signal that passes may be dynamically selected. Here, the SAW devices 650a-d may serve, for example, as a bandpass filter.

The mixer circuitry 640a-d includes circuitry which mix the processed signals with signals produced by the local oscillators 630a-d to produce a set of products. The signals produced by the local oscillators 630a-d may include fixed frequencies that may be produced by SAW devices 100 that may be employed by the local oscillators 630a-d.

The set of products are transferred from the mixers 640a-d to the detection circuitry 620. The detection circuitry 620 processes the set of products and produces an output that reflects intelligence (e.g., audio, digital data) conveyed in the set of products.

Note that a SAW device 650 is tunable to a range of frequencies that coincide with a range of frequencies associated with a communication channel used by the signal received by the antenna 660. Thus, the SAW device 650 may have full use of the entire communication channel. Tuning of the SAW device 650 may be accommodated by a microcontroller (not shown) that may coordinate an overall response of the system 600.

SAW device 100 are used in various applications. For example, a SAW device 100 is potentially used for radio and microwave frequency filtering. Specifically, SAW device 100 may be used to provide, for example, notch filtering and/or band pass filtering.

It should be noted that a bandwidth of the SAW device 100 may be broadened by distorting a geometry of the resonance region 140 such that wavelength of the acoustic wave is not the same in all angular directions. For example, in a material with isotropic sound velocity, making the resonance region 140 slightly oval may result in a spread of resonant frequencies.

Another application for SAW device 100 include sensing. Waves that travel in the SAW device 100 may be sensitive to an effect of material added to the resonance region 140. The SAW device 100 may be used for sensing applications owing to a large percentage of surface area provided by the resonance region 140 that is affected by mass addition.

Due to, its size and design, SAW device 100 can be used to test for example, analytes. SAW device 100 can be configured to operate with a sensitized film deposited on the resonance region 140. In addition, SAW device 100 can be configured to operate under liquids, thus it may be used to, for example, detect a mass of antibody receptors that may bind directly to the resonance region 140.

Drumhead modes associated with SAW device 100 may enable the SAW device 100 to serve as a speaker operating in the MHz range of ultrasound. For example, the SAW device 100 may be acoustically coupled to a hydrophone via a water drop. Ultrasonic sound may be detected above a background noise level near a resonant frequency of the SAW device 100. Using the hydrophone as an emitter, the SAW device 100 may also be used for the reception of ultrasonic sound.

Note that embodiments herein can include expanded frequency capability of the BUZSAW devices. Using the same geometry and device size range as would be used for devices with operating frequencies in the 10's of MHz range as discussed herein in FIGS. 2A, 2B, 3A, 3C, etc., an additional set of resonance can be observed at significantly higher frequencies (up to or more than 25 GHz). These higher frequency modes are repeatable across multiple devices. Examples of transmission spectra for these modes are shown in FIGS. 9-11.

Figure 9:
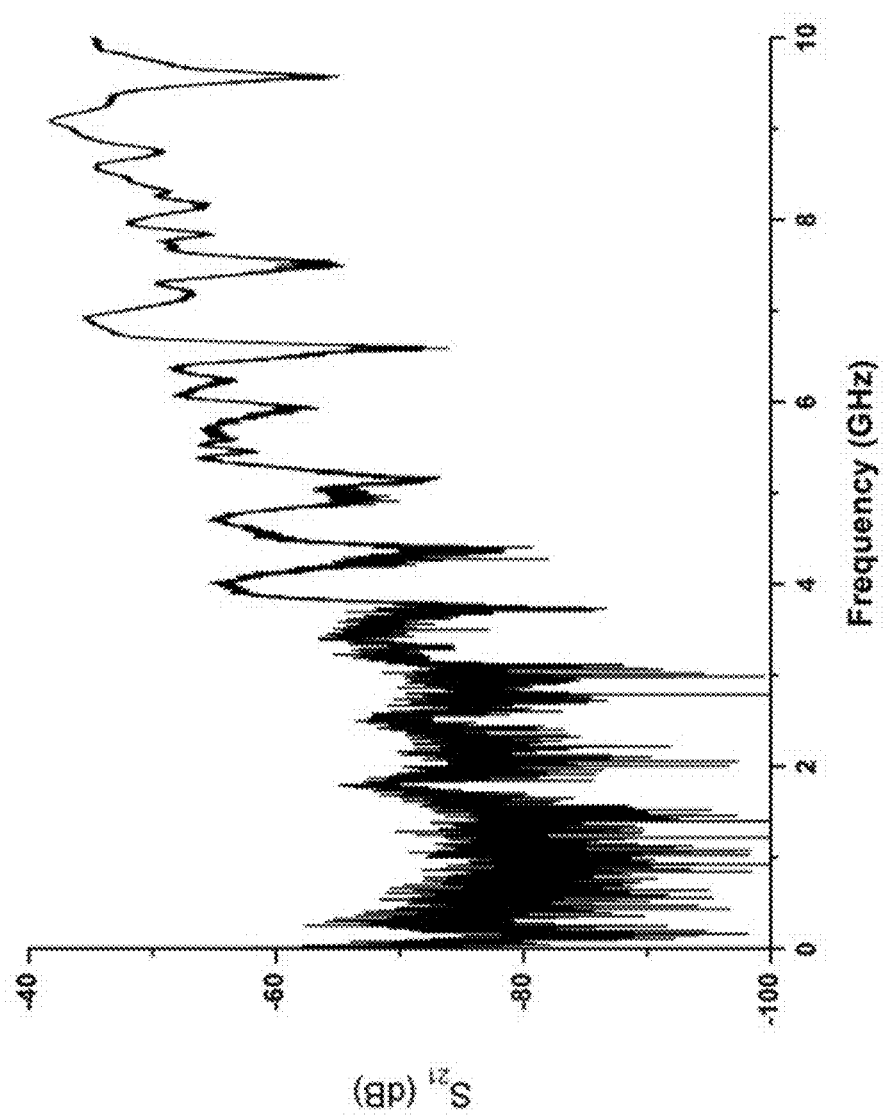
FIGS. 9 and 10 is an example diagram illustrating transmission spectra of an SAW device without impedance matching showing multiple resonance peaks in the GHz range according to embodiments herein.
Figure 10:
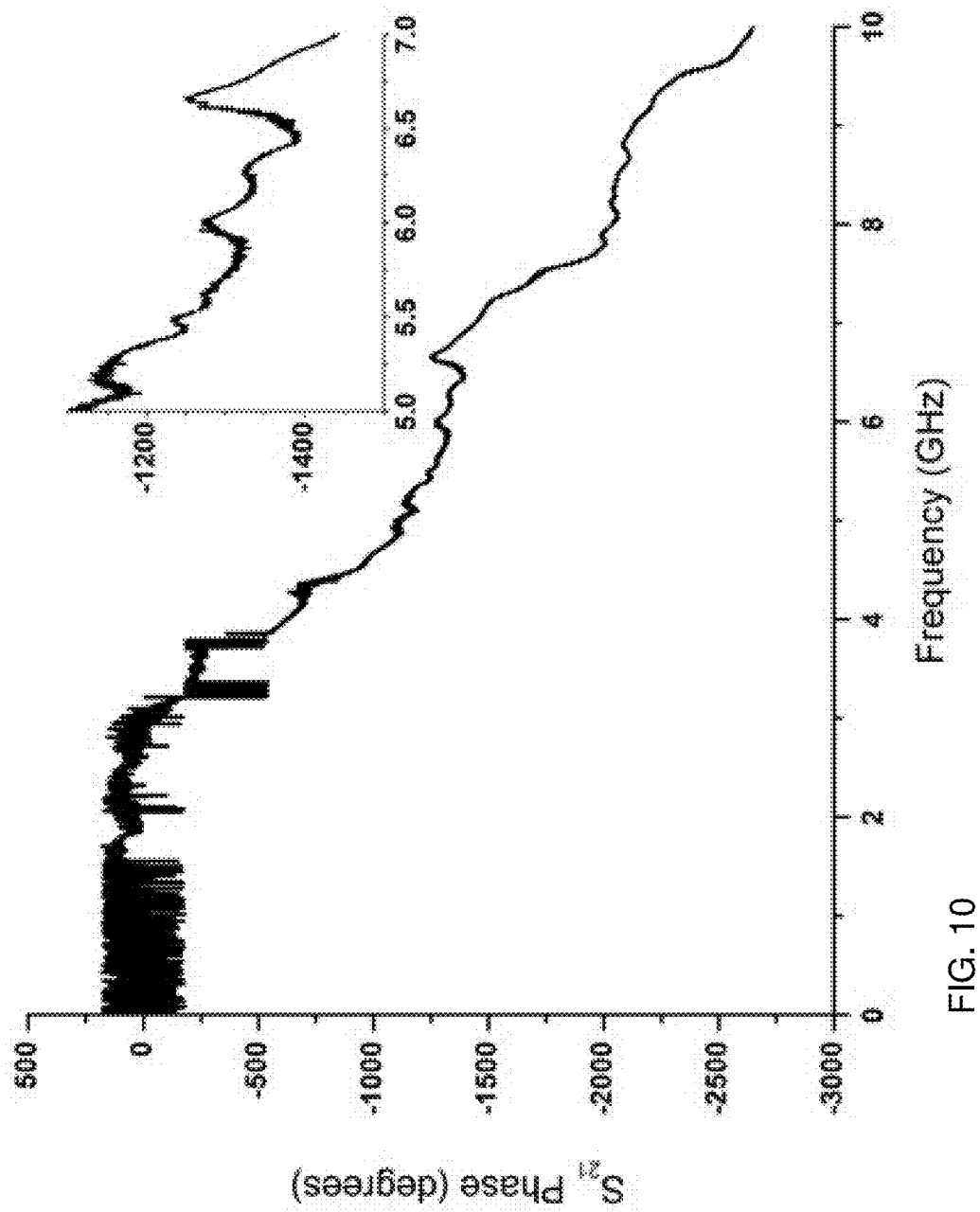

FIGS. 9 and 10 illustrate transmission spectra of an SAW device without impedance matching showing multiple resonance peaks in the GHz range according to embodiments herein. The corresponding phase plot indicating large phase shifts associated with the transmission peaks confirms these are due to resonance.

Figure 11:
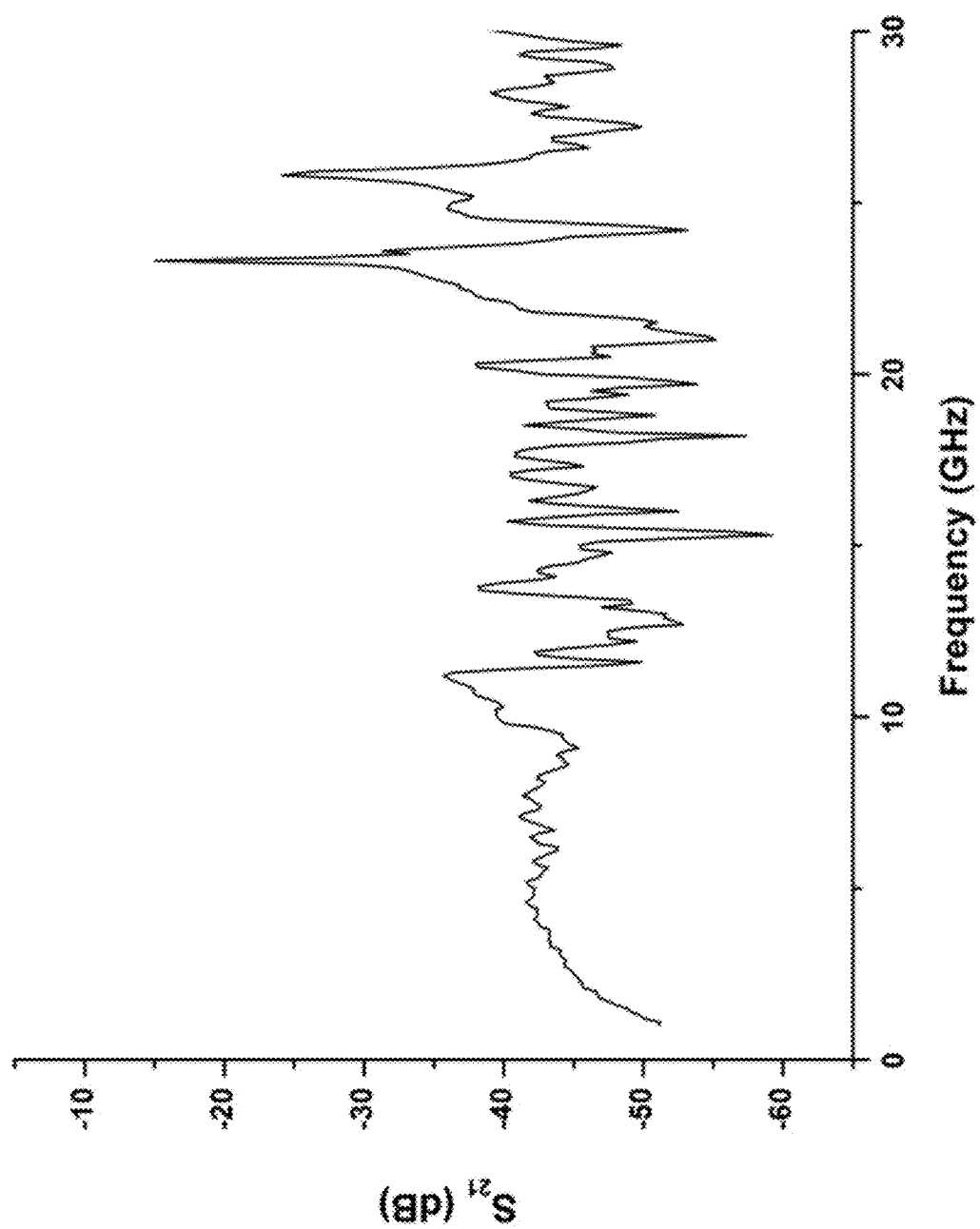
FIG. 11 is an example diagram illustrating transmission spectra of a device without impedance matching showing numerous resonance peaks, including two particularly strong peaks at 23 and 26 GHz according to embodiments herein.

FIG. 11 illustrates transmission spectra of a device without impedance matching showing numerous resonance peaks, including two particularly strong peaks at 23 and 26 GHz according to embodiments herein.

One explanation is that these expanded resonances are exciting a never before seen acoustic mode in the quartz with a much higher surface velocity.

Figure 12:
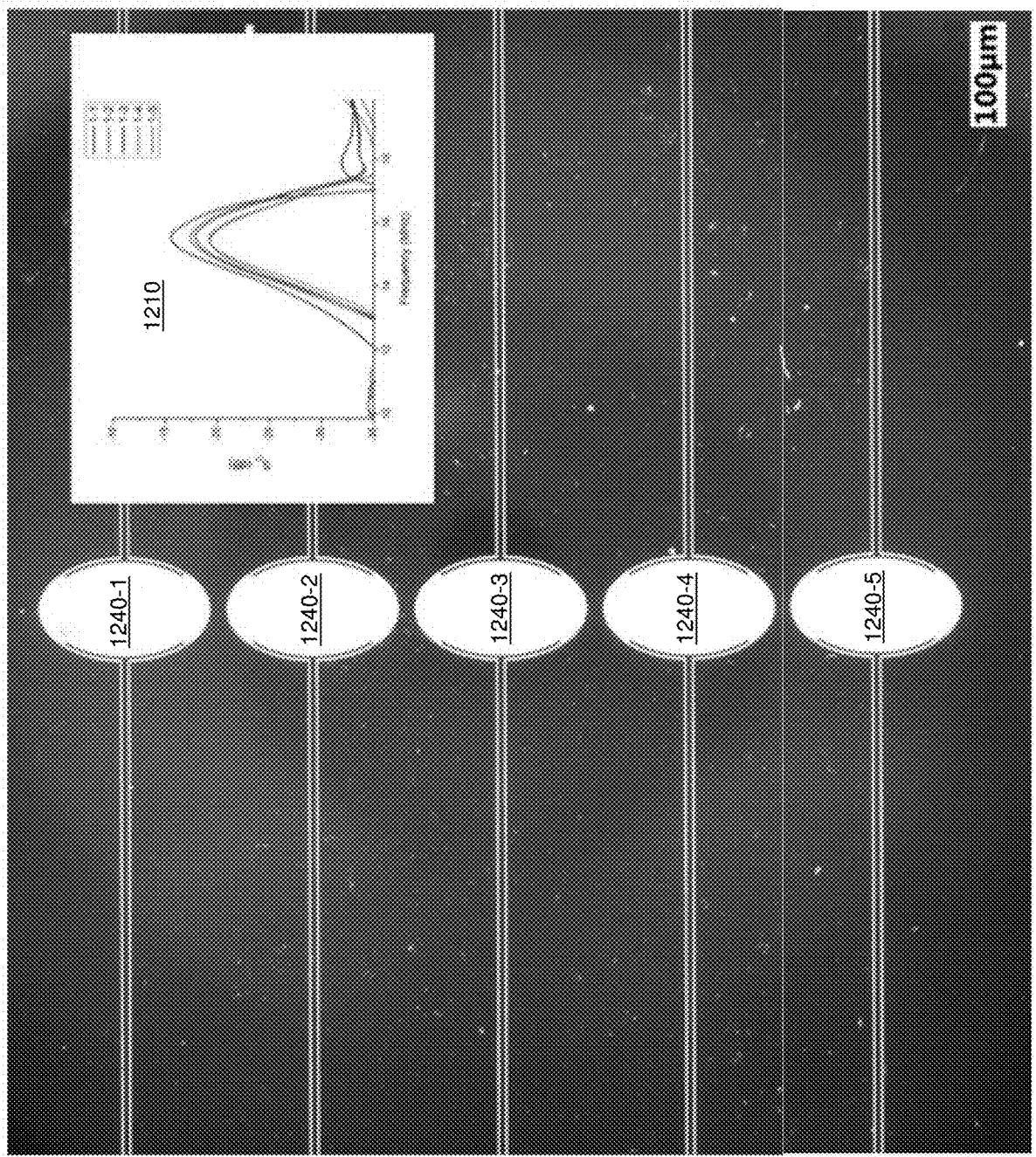
FIG. 12 is an example diagram illustrating a micrograph topology of five closely spaced BUZSAW (Bessel Undulation in the Z direction) devices designed to provide acoustical cross-talk according to embodiments herein.

FIG. 12 is an example diagram illustrating a micrograph topology of five closely spaced BUZSAW devices designed to have acoustical cross-talk according to embodiments herein. The graph 1210 illustrates that acoustic energy inserted into the lowest device can traverse the array and be detected on the adjustment devices.

In this example embodiment, an array of closely spaced SAW devices 1240-1, 1240-2, 1240-3, 1240-4, and 1240-5 is disposed on substrate. Acoustic energy inputted into one device is detected in one or more adjacent devices.

Such a configuration forms an acoustical band-structure, much like the electronic band-structure in a crystal. This may enable yet more control over the transmission characteristics of the devices 1240. It also serves as proof of principle that two adjacent devices can be acoustically coupled, possibly enabling devices that achieve RF mixing via acoustic mixing.

Figure 13:
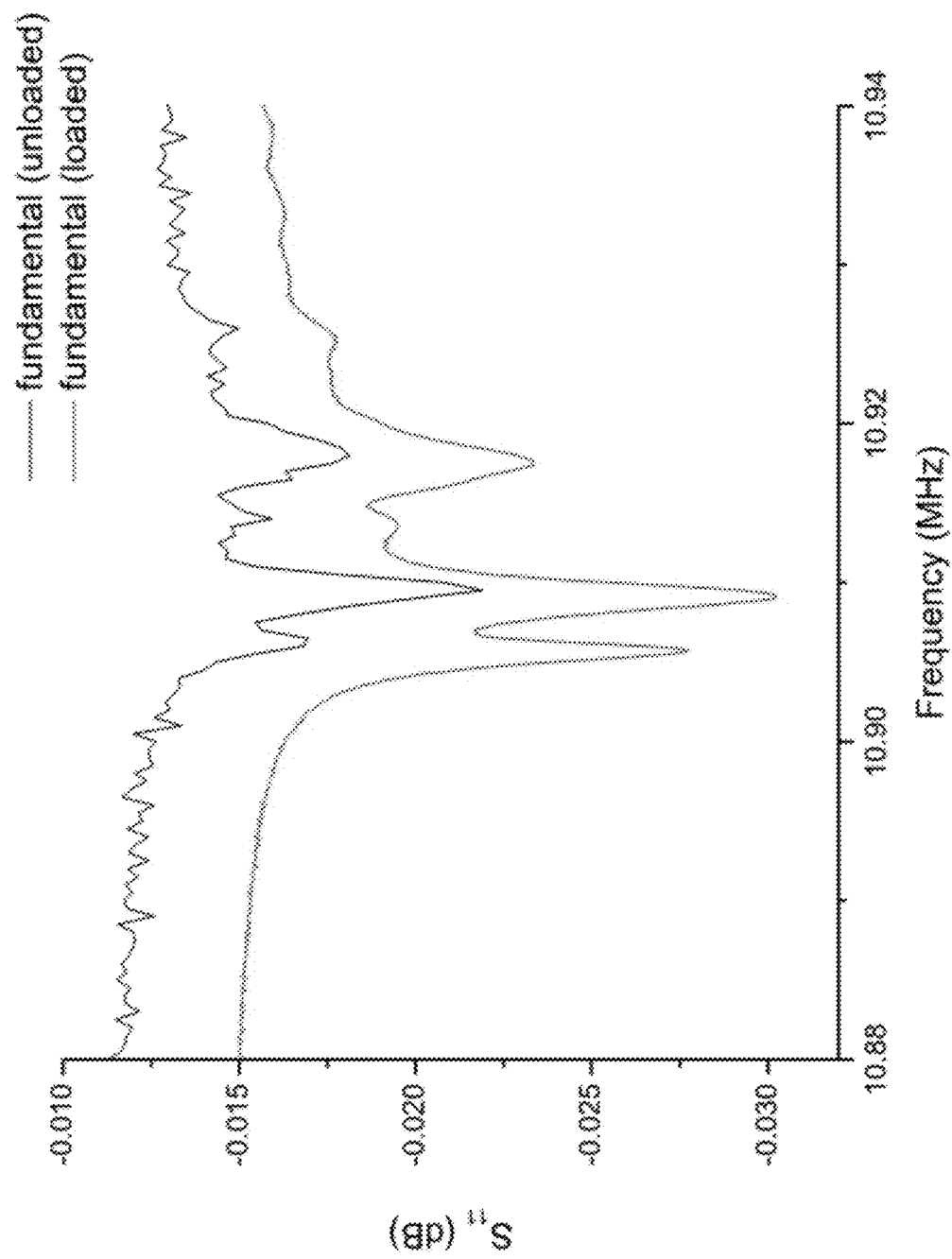
FIG. 13 is an example diagram illustrating reflection spectra of the device operating in air and loaded with water according to embodiments herein.

FIG. 13 is an example diagram illustrating reflection spectra of a device operating in air and loaded with water according to embodiments herein. In this example embodiment, the devices as discussed herein were tested for operation submerged under water and were found that they will continue to operate as shown in FIG. 13. In comparison, Rayleigh wave SAW devices cannot operate with a liquid load without sever damping. The increase in the dip in the reflection measurement (S11) can be understood as an increase in energy being transferred out of the device as acoustic waves in the water.

Applications:

Application #1. A primary application for SAW devices as discussed herein is for radio and microwave frequency filtering. In certain embodiments, the bandwidth of the device may be broadened by distorting the geometry such that wavelength of the acoustic wave is not the same in all angular directions. For example, in a material with isotropic sound velocity, making the device and corresponding resonance region slightly oval or elliptical (as opposed to being circular or round) will result in a greater spread of resonant frequencies.

Application #2. The ability to easily and controllably alter the resonant frequency of a SAW device would represent a significant advance. This can be accomplished by replacing the material that sits within the inner ring of the device with a membrane, such as silicon nitride or graphene for example, where the membrane's tension can be adjusted by way of applied electrostatic force or changes in the differential air pressure on either side of the membrane.

Figure 14:
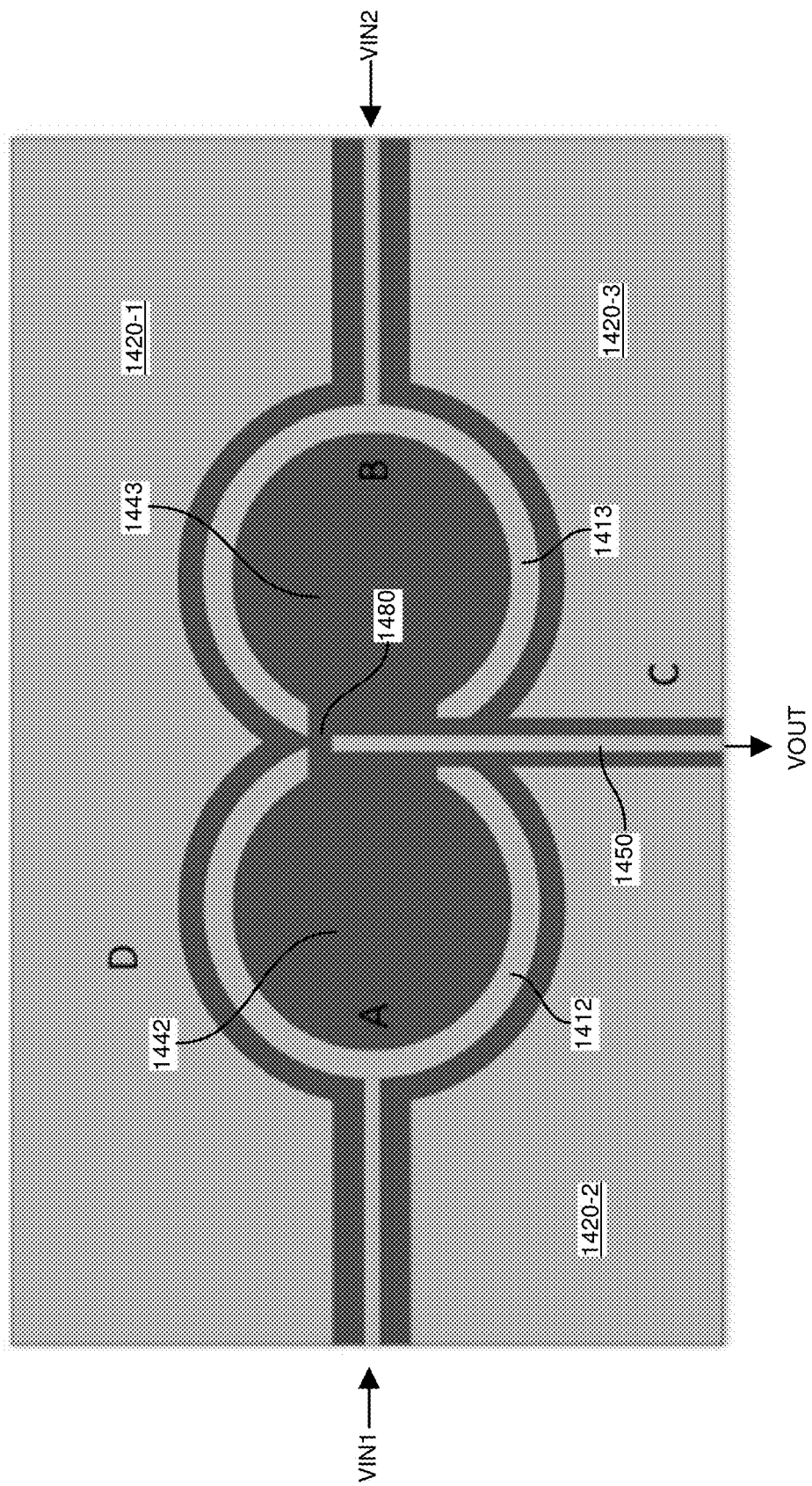
FIG. 14 is an example diagram illustrating a coupled BUZSAW device for frequency mixing according to embodiments herein.

Application #3. FIG. 14 is an example diagram illustrating a coupled BUZSAW devices for frequency mixing according to embodiments herein. In this example embodiment, the aperture (such as at interface 1480) between two devices (A and B) allows acoustic waves to mix at the interface 1480. This embodiment allows a signal injected from curved electrode 1412 into resonance region 1442 and a signal injected from curved electrode 1413 into resonance region 1443 to be collected or received at electrode 1450.

In one embodiment, an electronic circuit generates voltage Vin1 inputted to curved electrode 1412 to produce first acoustical waves in resonance region 1412. An electronic circuit generates voltage Vin2 inputted to curved electrode 1413 to produce second acoustical waves in resonance region 1412. Electrode 1450 converts the first acoustical waves and second acoustical waves into output voltage Vout (mixed frequency signal including frequencies of the first acoustical waves and frequencies of the second acoustical waves).

Thus, according to FIG. 14, it may also be possible to achieve frequency mixing functions via use of two SAW devices A and B connected to each other via a narrow aperture (interface 1480). In other words, a narrow opening between the devices A and B would result in the acoustic waves from each mixing together at the respective boundary between the two devices to produce Vout at the combined respective frequencies. Electrode 1450 collects the combined signal 1430 positioned at that boundary and outputs a respective voltage signal Vout to attached electronic circuitry. If desired, use of nonlinear acoustic materials potentially magnifies the mixing affect.

Application #4. Note that another common application for SAW devices is sensing. The acoustic waves are very sensitive to the effect of material added to the surface along the path they travel. The BUZSAW as discussed herein can be optimized for sensing applications owing to the large percentage of its surface area that is affected by mass addition (the region inside the inner ring, resonance region). Likewise the small size relative to linear SAW and simplified design would enable fabrication of arrays of these devices for testing multiple analytes. Also, given the ability to function under liquids, it is also possible to bind antibody receptors directly to the surface and directly detect the attached mass.

Figure 15:
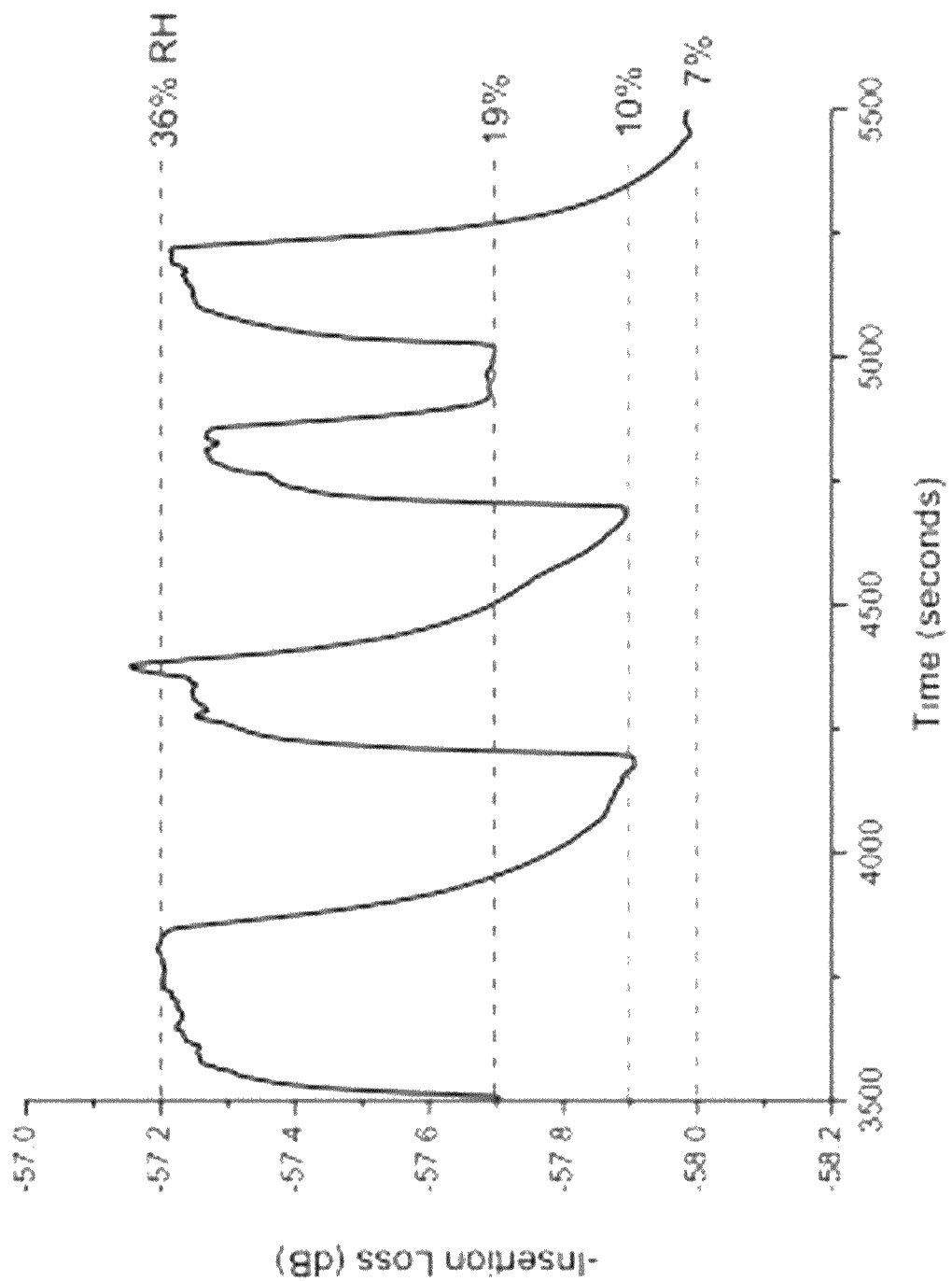
FIG. 15 is an example diagram illustrating S21 insertion loss (negative) for an uncoated sensor according to embodiments herein.

FIG. 15 is an example diagram illustrating S21 insertion loss (negative) for uncoated sensor according to embodiments herein. Higher humidity results in water adsorption on the sensor surface. The logarithmic shape of the curve reflects the real time change in humidity and isn't a sensor delay.

As a proof of concept, we monitored the change in frequency and insertion loss (Transmission of a single through the device) for an uncoated device in a humidity controlled environment. Humidity was reduced by the addition of dry nitrogen and monitored with a high accuracy humidity meter. The thickness of the water film on a surface is a function of the relative humidity of the air. The exact mass of water on the surface can be calculated from well-known formulae, which can then be compared to the response of the device. The SAW showed very good responses to changes in humidity (FIG. 15).

Figure 16:
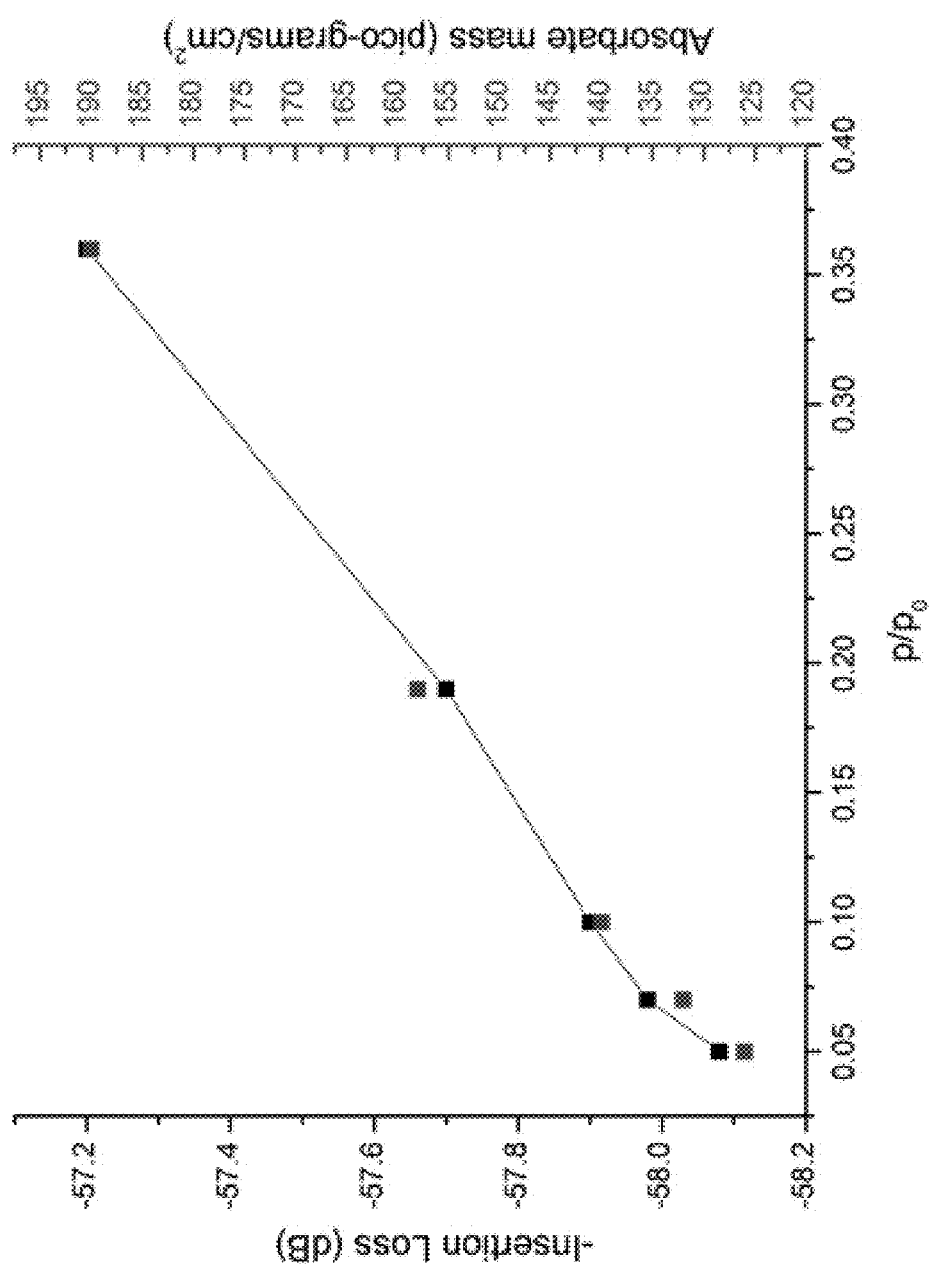
FIGS. 16 and 17 are example diagrams illustrating comparison of device response to mass change of absorbed water layer on BUZSAW (a) and to the formation of a monolayer of methyl groups attached to the surface due to exposure to hexamethyldisilazane vapor (b) according to embodiments herein.
Figure 17:
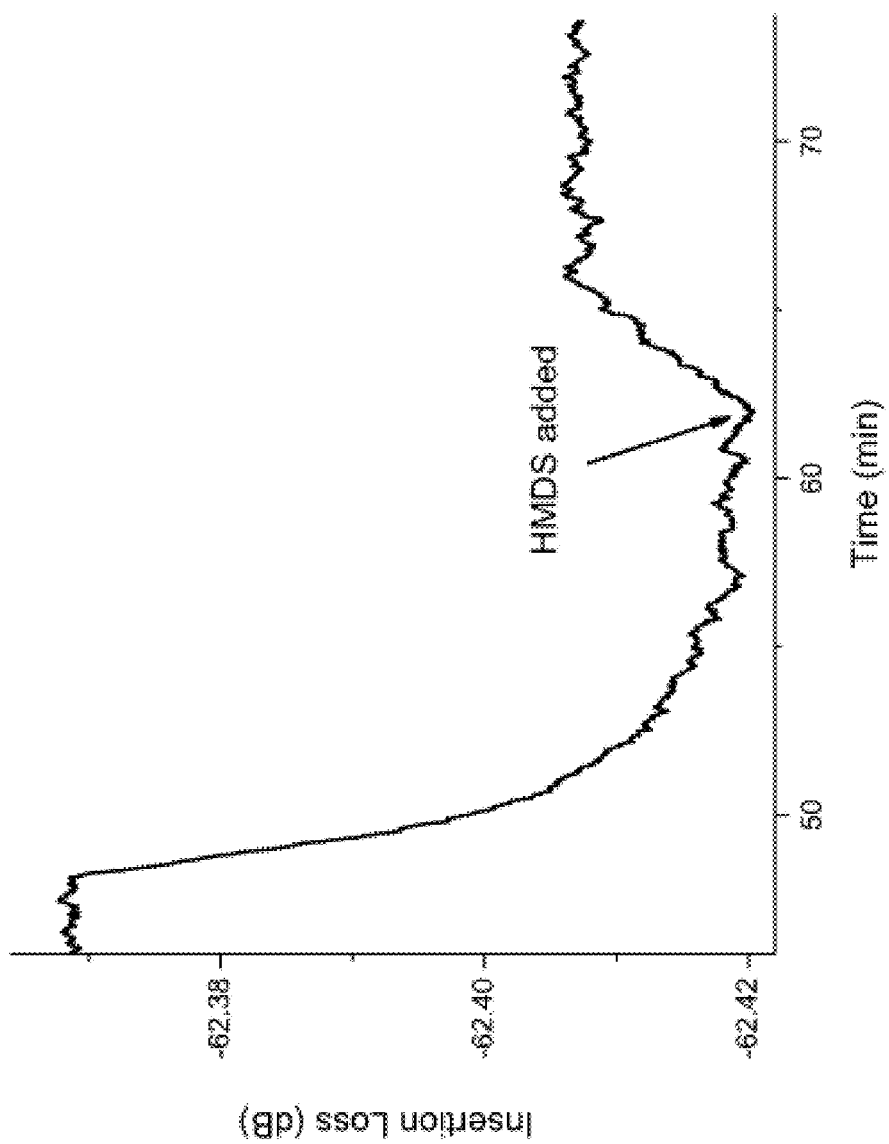

FIGS. 16 and 17 are example diagrams illustrating comparison of device response to mass change of absorbed water layer on BUZSAW (a) and to the formation of a monolayer of methyl groups attached to the surface due to exposure to hexamethyldisilazane vapor (b). Here, the saturation of the surface with the methyl groups can be seen when the insertion loss stops changing.

Comparing the response of the device to the relative mass change (FIG. 10) and considering a limit of 0.01 dB sensitivity for changes in insertion loss, yields a measure of the mass change sensitivity of the current device of 5 pg/cm2.

Figure 18:
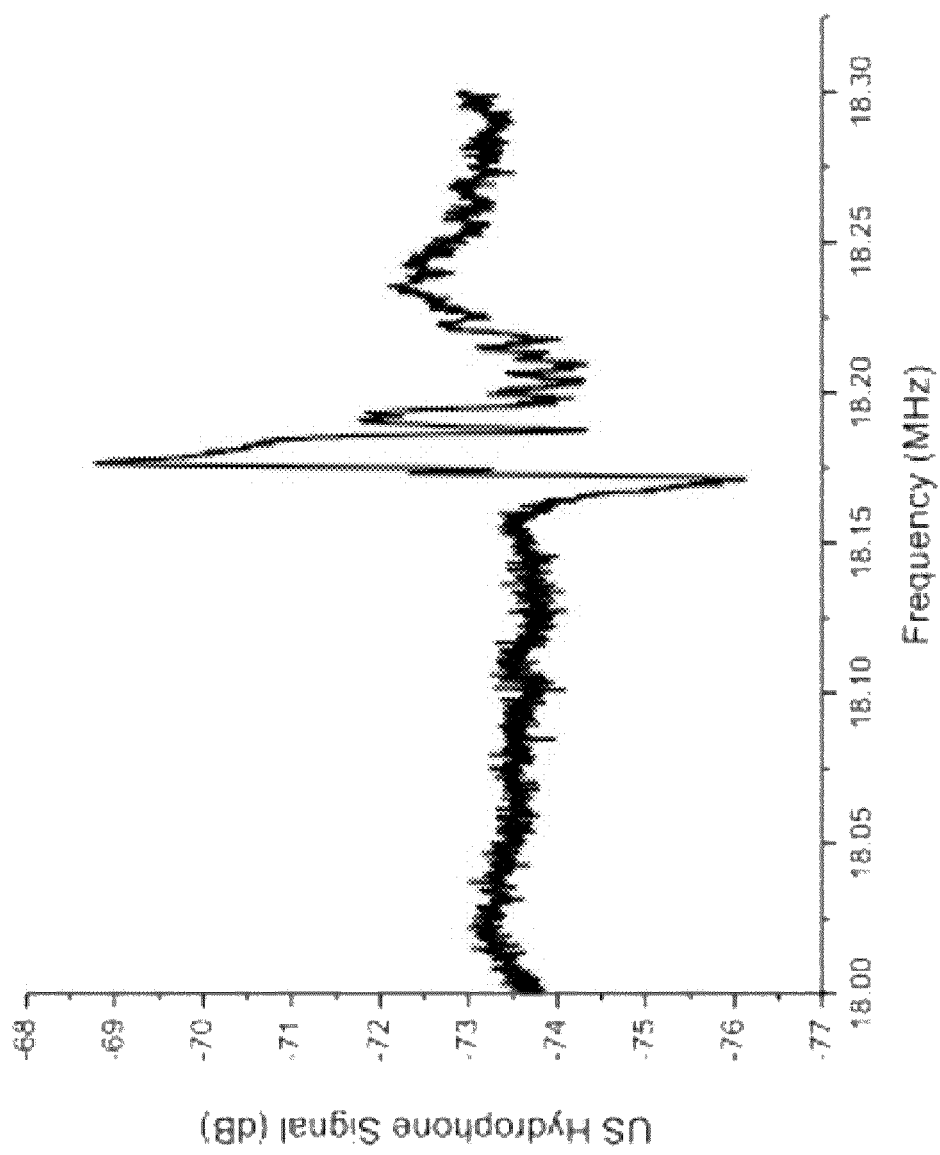
FIGS. 18 and 19 are diagrams illustrating examples of ultrasound emission from BUZSAW device (left) and reception of incoming ultrasound (right) according to embodiments herein.
Figure 19:
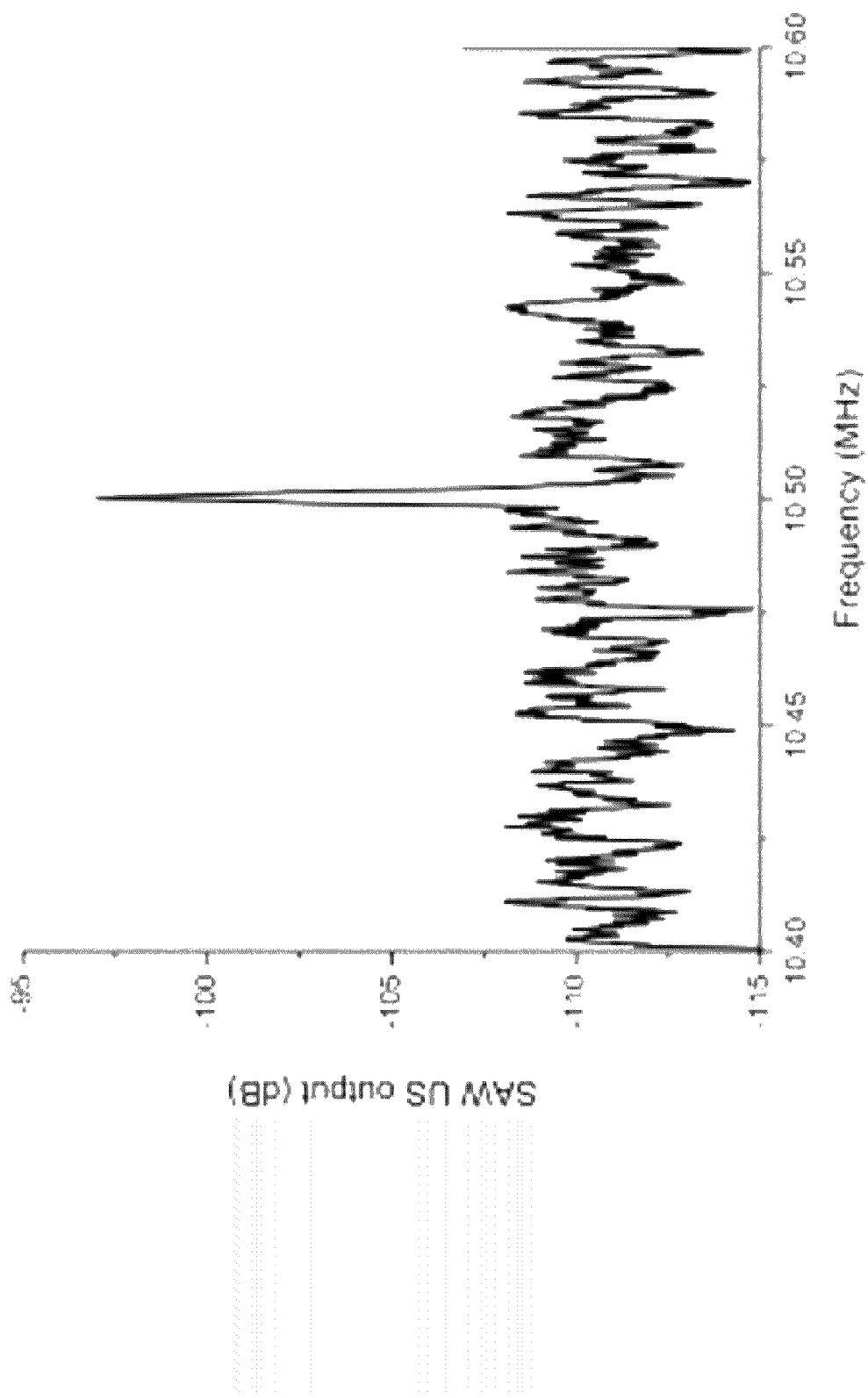

FIGS. 18 and 19 are diagrams illustrating examples of ultrasound emission from BUZSAW device (left) and reception of incoming ultrasound (right) according to embodiments herein.

Application #5. The so-called drumhead modes of the device suggest that the BUZSAW devices as discussed herein may be able to serve as a speaker operating in the MHz range of ultrasonics. To test this, a BUZSAW device as previously discussed was acoustically coupled to a hydrophone via a water drop. Ultrasound was detected above the background noise level near the resonant frequencies of the device (FIGS. 18 and 19). The signal is not strong due in part to the small size of the source compared to the hydrophone and the fact that the device was only operated at 10V whereas most ultrasonic devices are driven at 100's of volts.

Reception of ultrasound by the BUZSAW was also demonstrated by using the hydrophone as an emitter. This is far from an optimal setup, but despite this, a signal is received by the BUZSAW, where the incoming ultrasound is converted to an electrical signal.

Figure 20:
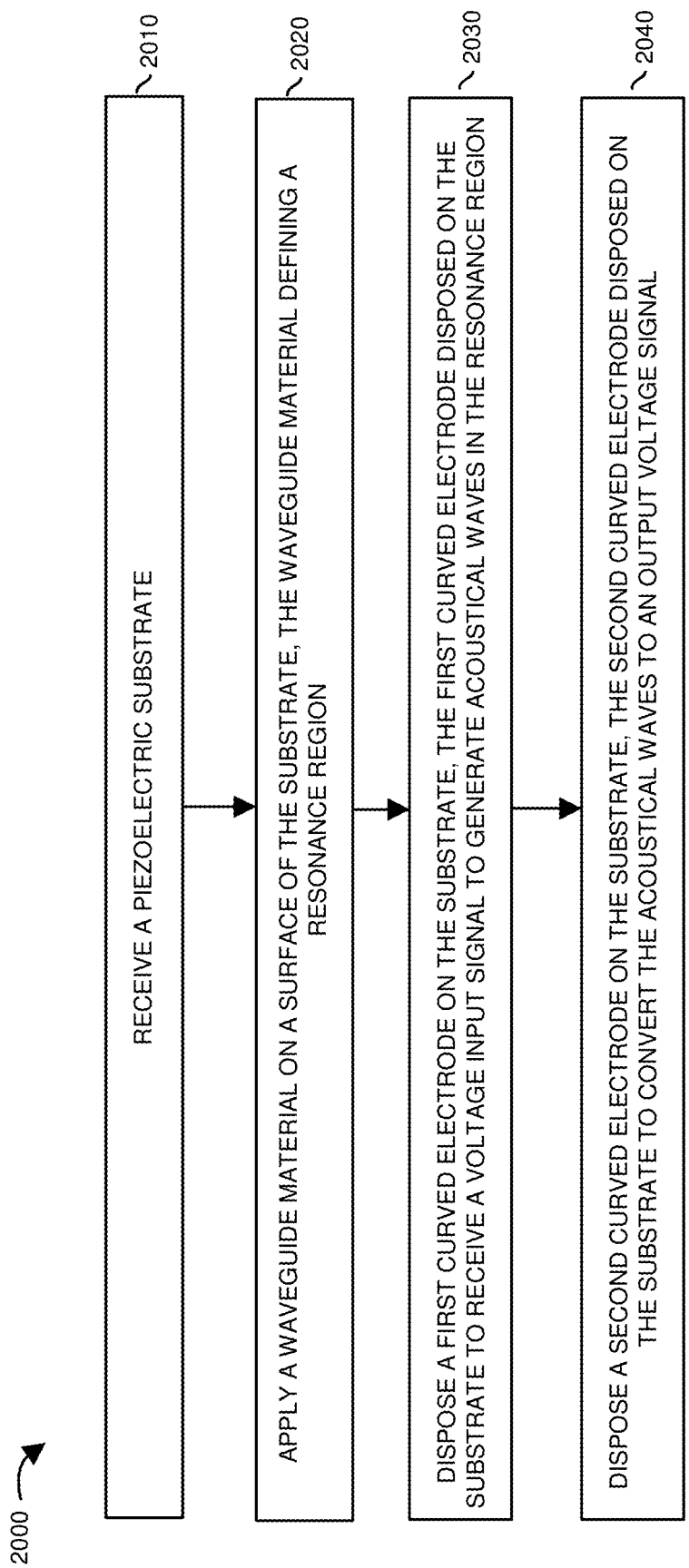
FIGS. 20 and 21 are example diagrams illustrating fabrication methods according to embodiments herein.

Used as an ultrasound transducer, the BUZSAW can be fabricated in an array to be used for 3D imaging. The simplicity of the design would enable applications in portable ultrasound. Extended further, if this was fabricated on an inexpensive flexible piezoelectric material, such as PVDF, it might be conceivable to have a flexible transducer that could be applied to the body like a sticker FIG. 20 is a flowchart 2000 illustrating an example method according to embodiments. Note that there will be some overlap with respect to concepts as discussed above.

In processing operation 2010, a device fabricator receives a piezoelectric substrate.

In processing operation 2020, the device fabricator applies a layer of conductive material on a surface of the substrate, the layer of conductive material defines a resonance region.

In processing operation 2030, the device fabricator disposes a first curved electrode on the substrate; the first curved electrode is disposed on the substrate to receive a voltage input signal to generate acoustical waves in the resonance region.

In processing operation 2040, a device fabricator disposes a second curved electrode on the substrate; the second curved electrode is disposed on the substrate conversion of the acoustical waves into an output voltage signal.

Figure 21:
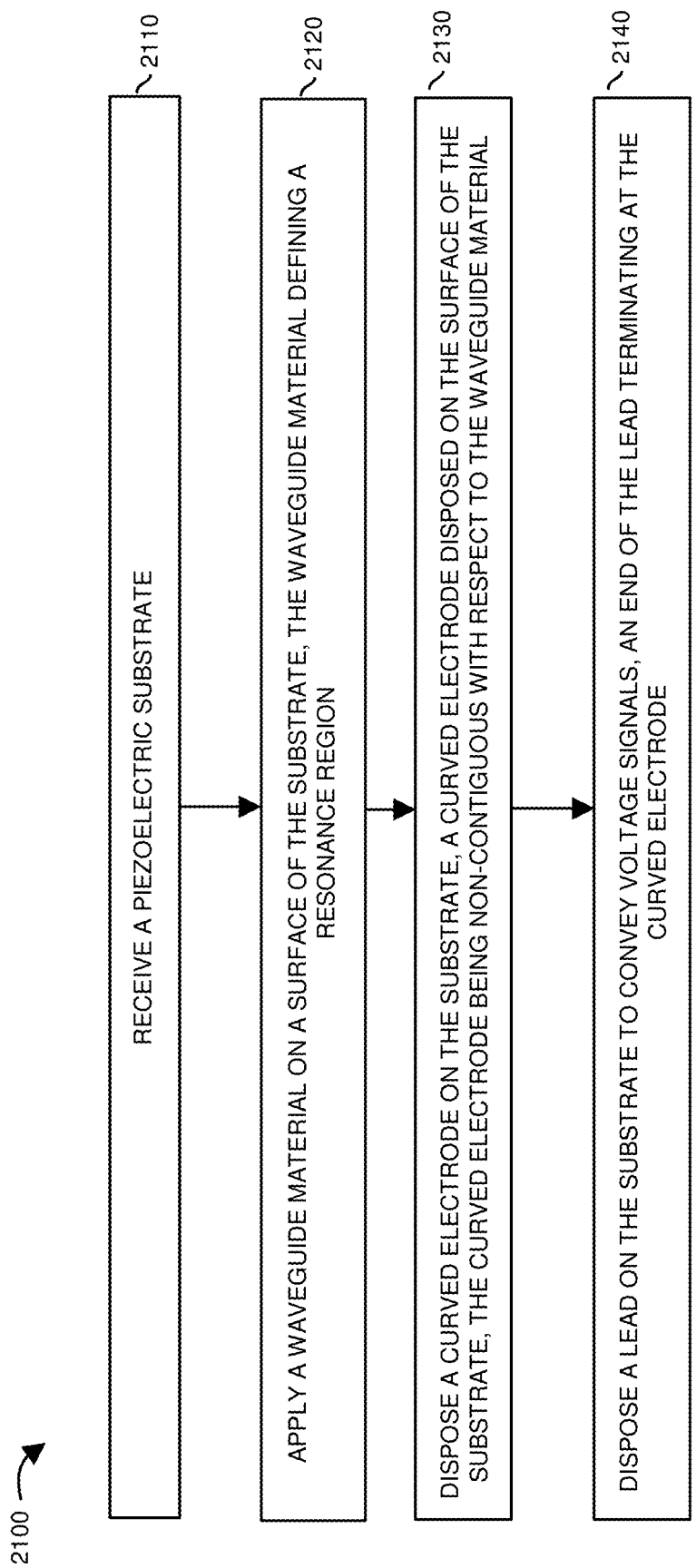

FIG. 21 is a flowchart 2100 illustrating an example method according to embodiments. Note that there will be some overlap with respect to concepts as discussed above.

In processing operation 2110, a device fabricator receives a piezoelectric substrate.

In processing operation 2120, the device fabricator applies a layer of electrically conductive material on a surface of the substrate. The layer of electrically conductive material defines a resonance region.

In processing operation 2130, the device fabricator disposes a curved electrode on the substrate. The curved electrode is fabricated to be non-contiguous with respect to the waveguide material. In one embodiment, as previously discussed, the strip of electrically conductive material is continuous to form an elliptically shaped ring on the surface of the substrate.

In processing operation 2140, the device fabricator disposes a lead (such as a strip of electrically conductive material) on the substrate to convey voltage signals; an end of the lead terminate at the curved electrode.

Note again that techniques herein are well suited to produce acoustical devices. However, it should be noted that embodiments herein are not limited to use in such applications and that the techniques discussed herein are well suited for other applications as well. This design eliminates the need for the large number of electrode pairs, thus maximizing the area used for sensing. It also is self-aligned and as such does not have problems with phase matching. In addition, the device is much smaller than a linear SAW operating at the same frequency (~2000× smaller). The electrode structure also enables intrinsic impedance matching without the need for an external matching network. This is all while maintaining the beneficial properties of the linear SAW and sharing all instances of application. There is also the possibility to fabricate a widely tunable SAW filter and frequency mixer. Beyond conventional SAW, this device has been shown to function as an ultrasound transducer.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. A device comprising:
a substrate including a resonance region;
a first curved electrode disposed on the substrate, the first curved electrode operable to receive a voltage input signal, the voltage input signal operable to generate acoustical waves from the first curved electrode into the resonance region; and
a second curved electrode operable to convert the acoustical waves received from the resonance region to an output voltage signal.

2. The device as in claim 1, wherein the substrate is piezoelectric material, the resonance region operable to convey the acoustical waves from the first curved electrode to the second curved electrode.

3. The device as in claim 2, wherein the first curved electrode is disposed on the substrate as a first metal strip; and
wherein the second curved electrode is disposed on the substrate as a second metal strip.

4. The device as in claim 2, wherein the resonance region, in a drumhead mode, is operable to output an acoustical signal orthogonal to a planar surface of the resonance region disposed on the surface of the substrate.

5. The device as in claim 1, wherein the resonance region includes at least a surface of the substrate between the first curved electrode and the second curved electrode.

6. The device as in claim 1, wherein the first curved electrode is disposed opposite the second curved electrode in the resonance region.

7. The device as in claim 2, wherein the resonance region is elliptical in shape as defined by a layer of electrically conductive material disposed on the surface of the substrate.

8. The device as in claim 7, wherein the electrically conductive material includes metal;
wherein the first curved electrode is driven with the voltage input signal to produce the acoustical waves in the resonance region; and
wherein the electrically conductive material is driven to a second voltage.

9. The device as in claim 1, wherein physical attributes of the resonance region define a frequency of the acoustical waves propagating through the resonance region.

10. The device as in claim 9, wherein the output voltage signal oscillates at the frequency of the acoustical waves.

11. The device as in claim 1, wherein the resonance region is curved in shape as defined by a layer of electrically conductive material on the substrate.

12. The device as in claim 11, wherein an edge of the first curved electrode is substantially parallel to a first curved boundary of the layer of electrically conductive material, the first curved electrode being spaced apart from the first curved boundary via a first gap; and
wherein an edge of the second curved electrode is substantially parallel to a second curved boundary of the layer of electrically conductive material, the second curved electrode being spaced apart from the second curved boundary via a second gap.

13. The device as in claim 11 further comprising:
a first gap disposed between the first curved electrode and a first boundary of the layer of electrically conductive material, the first gap disposed opposite a core resonance region between the first curved electrode and the second curved electrode; and
a second gap disposed between the second curved electrode and a second boundary of the layer of electrically conductive material, the second gap disposed opposite the core resonance region.

14. The device as in claim 11, wherein the layer of electrically conductive material includes metal;
wherein the first curved electrode is driven with the voltage input signal to produce the acoustical waves in the resonance region; and
wherein the layer of electrically conductive material is driven to a second voltage.

15. The device as in claim 1, wherein the resonance region is an exposed non-metalized waveguide.

16. The device as in claim 1, wherein the resonance region is fabricated from a non-electrically conductive material.

17. The device as in claim 1, wherein the first curved electrode is disposed opposite the second curved electrode, a concave portion of the first curved electrode facing a concave portion of the second electrode.

18. The device as in claim 1 further comprising:
a third electrode disposed on the substrate in the resonance region, the third electrode operative to detect the acoustical waves transmitted from the first curved electrode to the second electrode.

19. The device as in claim 1, wherein an impedance associated with the first curved electrode is controlled based on circuitry driving the first curved electrode.

20. The device as in claim 1, wherein a resonant frequency of the acoustical waves is defined at least in part based on a width of the resonance region.

21. The device as in claim 1, wherein the first curved electrode is a strip of conductive material disposed substantially parallel to a boundary of the resonance region; and
wherein the acoustical waves warp a surface of the resonance region.

22. A method comprising:
receiving a piezoelectric substrate;
applying electrically conductive material to a surface of the piezoelectric substrate, boundaries of the electrically conductive material defining a resonance region;
disposing a first curved electrode on the substrate, the first curved electrode disposed on the substrate to receive a voltage input signal to generate acoustical waves in the resonance region; and disposing a second curved electrode on the substrate, the second curved electrode disposed on the substrate to convert the acoustical waves to an output voltage signal.

23. The method as in claim 22, wherein the substrate is piezoelectric material; and wherein the resonance region is disposed on the piezoelectric material to convey the acoustical waves from the first curved electrode to the second curved electrode.

24. The method as in claim 23 further comprising:

disposing the first curved electrode on the substrate as a first metal strip; and disposing the second curved electrode on the substrate as a second metal strip.

25. The method as in claim 22 further comprising:

disposing the first curved electrode opposite the second curved electrode in the resonance region, a concave portion of the first curved electrode facing a concave portion of the second electrode.

26. The method as in claim 22, wherein the resonance region is elliptical in shape as defined by the electrically conductive material disposed on the surface of the substrate.

27. The method as in claim 22, wherein physical attributes of the resonance region define a frequency of the acoustical waves propagating through the resonance region.

* * * * *